US012559648B2

(12) United States Patent
Kato et al.

(10) Patent No.: US 12,559,648 B2
(45) Date of Patent: Feb. 24, 2026

(54) METHOD OF MANUFACTURING METAL STRUCTURE FOR OPTICAL SEMICONDUCTOR DEVICE, PACKAGE, AND SOLUTION CONTAINING POLYALLYLAMINE POLYMER

(71) Applicant: NICHIA CORPORATION, Anan (JP)

(72) Inventors: Yasuo Kato, Anan (JP); Kazuya Matsuda, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 814 days.

(21) Appl. No.: 17/756,634

(22) PCT Filed: Nov. 20, 2020

(86) PCT No.: PCT/JP2020/043380
§ 371 (c)(1),
(2) Date: May 27, 2022

(87) PCT Pub. No.: WO2021/106781
PCT Pub. Date: Jun. 3, 2021

(65) Prior Publication Data

US 2023/0002637 A1 Jan. 5, 2023

(30) Foreign Application Priority Data

Nov. 29, 2019 (JP) ................................ 2019 216173
Jan. 31, 2020 (JP) ................................ 2020-014772

(51) Int. Cl.
*C09D 179/02* (2006.01)
*C08K 5/378* (2006.01)
(Continued)

(52) U.S. Cl.
CPC ....... *C09D 179/02* (2013.01); *H10H 20/8506* (2025.01); *H10H 20/852* (2025.01); *C08K 5/378* (2013.01); *H10H 20/0364* (2025.01)

(58) Field of Classification Search
CPC ............ C09D 179/02; H10H 20/8506; H10H 20/852; H10H 20/0364; H10H 20/857;
(Continued)

(56) References Cited

U.S. PATENT DOCUMENTS 6,180,754 B1 * 1/2001 Stutts .................... C08G 73/02 528/495
2002/0100986 A1 * 8/2002 Soga .................. H01L 23/4924 257/E23.105
(Continued)

FOREIGN PATENT DOCUMENTS

JP 2003221684 A * 8/2003
JP 2003347596 A 12/2003
(Continued)

*Primary Examiner* — Chad M Dicke
*Assistant Examiner* — Gary Abel
(74) *Attorney, Agent, or Firm* — Hunton Andrews Kurth LLP

(57) ABSTRACT

A method of manufacturing a metal structure for an optical semiconductor device, including a treatment step (1) of immersing in and/or applying the solution containing a polyallylamine polymer a base body, the base body including an outermost layer at a portion or entire surfaces of the base body, the outermost layer including a plating of at least one selected from the group consisting of gold, silver, a gold alloy, and a silver alloy, so as to manufacture the metal structure for an optical semiconductor device having an increased adhesion to a resin material.

17 Claims, 4 Drawing Sheets

(51) Int. Cl.
*H10H 20/01* (2025.01)
*H10H 20/85* (2025.01)
*H10H 20/852* (2025.01)

(58) Field of Classification Search
CPC ............... H10H 20/036; H10H 29/852; H10H 20/8502; H10H 20/8504; H10H 20/8508; H10H 29/8506; H10H 29/8508; H10H 20/85; H10H 29/8517; H10H 29/8552; H10H 29/0364; C08K 5/378; H01L 2224/32245; H01L 2224/48247; H01L 2224/48257; H01L 2224/73265; H01L 2224/97; H01L 23/14; H01L 23/48
See application file for complete search history.

(56) References Cited

U.S. PATENT DOCUMENTS

| | | | | |
|---|---|---|---|---|
| 2004/0000415 | A1* | 1/2004 | Rizzo | H05K 9/0075 257/E27.005 |
| 2004/0075161 | A1 | 4/2004 | Wang et al. | |
| 2004/0140551 | A1* | 7/2004 | Usui | H01L 23/49838 257/E23.07 |
| 2006/0189113 | A1* | 8/2006 | Vanheusden | B22F 1/0545 257/E21.174 |
| 2007/0212478 | A1 | 9/2007 | Fukunaga et al. | |
| 2007/0228391 | A1 | 10/2007 | Minami et al. | |
| 2008/0210971 | A1* | 9/2008 | Donofrio | H01L 24/05 257/E33.063 |
| 2008/0303157 | A1* | 12/2008 | Cheng | H01L 24/97 257/E23.141 |
| 2010/0181659 | A1 | 7/2010 | Hanson et al. | |
| 2011/0094630 | A1* | 4/2011 | Yoshida | C25D 13/20 148/247 |
| 2011/0169033 | A1 | 7/2011 | Fukunaga et al. | |
| 2013/0299859 | A1* | 11/2013 | Onai | H01L 24/97 438/26 |
| 2016/0029911 | A1* | 2/2016 | Lee | A61B 5/02427 600/407 |
| 2019/0086733 | A1* | 3/2019 | Min | G02F 1/133603 |
| 2020/0303286 | A1* | 9/2020 | Hishiki | H01L 23/49548 |

FOREIGN PATENT DOCUMENTS

| | | | |
|---|---|---|---|
| JP | 2004165647 | A | 6/2004 |
| JP | 2006093365 | A | 4/2006 |
| JP | 2007266343 | A | 10/2007 |
| JP | 2007266562 | A | 10/2007 |
| JP | 2009084465 | A | 4/2009 |
| JP | 2009245960 | A | 10/2009 |
| JP | 4776515 | B2 | 7/2011 |
| JP | 2011228589 | A | 11/2011 |
| JP | 2012111811 | A | 6/2012 |
| JP | 2013239540 | A | 11/2013 |
| JP | 2014063773 | A | 4/2014 |
| JP | 2014159618 | A | 9/2014 |
| JP | 5627980 | B2 | 10/2014 |
| WO | 2009020182 | A1 | 2/2009 |
| WO | 2010073660 | A1 | 7/2010 |

* cited by examiner

METHOD OF MANUFACTURING METAL STRUCTURE FOR OPTICAL SEMICONDUCTOR DEVICE, PACKAGE, AND SOLUTION CONTAINING POLYALLYLAMINE POLYMER

CROSS-REFERENCE TO RELATED APPLICATIONS

This is a national phase application based on International Patent Application No. PCT/JP2020/043380 filed Nov. 20, 2020, claiming priority to Japanese Patent Application No. 2019-216173 filed Nov. 29, 2019 and Japanese Patent Application No. 2020-014772 filed Jan. 31, 2020, the entire contents of which all are incorporated herein by reference.

TECHNICAL FIELD

The present invention relates to a method of manufacturing a metal structure for an optical semiconductor device, a package, and a solution containing a polyallylamine polymer.

BACKGROUND ART

Optical semiconductor devices containing semiconductor light-emitting elements (hereinafter also referred to as "light-emitting elements") such as light-emitting diodes (hereinafter also referred to as "LEDs") are used for, for example, light sources for vehicles, light sources for lighting for general use, backlights for liquid-crystal display devices, and light sources for projectors.

Optical semiconductor devices generally employ a lead frame or a substrate with a silver plating or a silver alloy plating on a surface thereof, the silver plating or the silver alloy plating having high reflectance with respect to light emitted from a light-emitting element. However, silver and silver alloys are apt to be sulfurized by sulfides. In view of this, an optical semiconductor device including a substrate with a gold plating, which is resistant to sulfur, on a surface of the substrate may be employed (for example, see Patent Literatures 1 and 2). An optical semiconductor device including a lead frame or a substrate with a gold plating or a gold alloy plating can be used as, for example, an optical semiconductor device for a vehicle, which are required to have high

CITATION LIST

Patent Literature

Patent Literature 1: Japanese Unexamined Patent Application Publication No. 2003-347596

Patent Literature 2: Japanese Unexamined Patent Application Publication No. 2006-093365

SUMMARY OF INVENTION

Technical Problem

An object of the present disclosure is to provide a method of manufacturing a metal structure for an optical semiconductor device in which adhesion to resin materials is increased.

Solution to Problem

A method of manufacturing a metal structure for an optical semiconductor device according to one embodiment of the present invention includes a treatment step (1) of immersing in and/or applying a solution containing a polyallylamine polymer a base body, the base body including an outermost layer at a portion or entire surfaces of the base body, the outermost layer including a plating of at least one selected from the group consisting of gold, silver, a gold alloy, and a silver alloy.

A package according to one embodiment of the present invention includes a base body including an outermost layer at a portion or entire surfaces of the base body, the outermost layer including a plating of at least one selected from the group consisting of gold, silver, a gold alloy, and a silver alloy and a resin-molded body formed on or above the base body, a polyallylamine polymer adhering to the outermost layer of the base body.

A solution containing a polyallylamine polymer according to an embodiment of the present invention is used to increase adhesion between a lead frame and an adjacent resin-molded body in an optical semiconductor device.

A method of manufacturing a metal structure for an optical semiconductor device according to an embodiment of the present invention includes a treatment step (1) of immersing in and/or applying a solution containing a polyallylamine polymer a base body, the base body including an outermost layer at a portion or entire surfaces of the base body, the outermost layer including a plating of at least one selected from the group consisting of gold, silver, a gold alloy, and a silver alloy.

Advantageous Effects of Invention

According to the present disclosure, a method of manufacturing a metal structure for an optical semiconductor device can be provided in which adhesion to resin materials is increased.

DESCRIPTION OF EMBODIMENTS

Figure 1A:
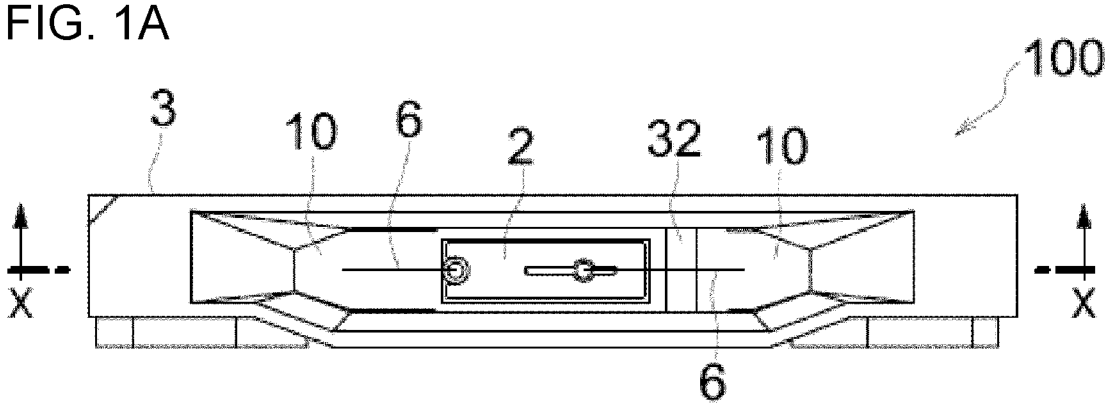
FIG. 1A is a schematic plan view of an optical semiconductor device according to an embodiment.

Embodiments of the invention will be described below referring to the accompanying drawings as appropriate. Methods of manufacturing a metal structure for an optical semiconductor device, packages, and solutions containing a polyallylamine polymer described below are intended as examples to give a concrete form to a technical idea of the present invention, and the present invention is not limited to the embodiments below unless specified otherwise. The compositions of plating solutions and plating conditions described regarding the embodiments are examples. Description in one embodiment are applicable to other embodiments. Sizes or positional relations of members illustrated in the drawings may be exaggerated in order to clarify the illustration. In the description below, the same term or reference numeral generally represents the same member or a member of a same material, and its detailed description may be omitted as appropriate.

In the specification of the present application, the term “include” is a concept encompassing all of “comprise”, “consist essentially of”, and “consist of”. In the specification of the present application, the range of values represented as “A to B” indicates “A or more and B or less”.

First Embodiment: (First) Optical Semiconductor Device

Figure 1B:
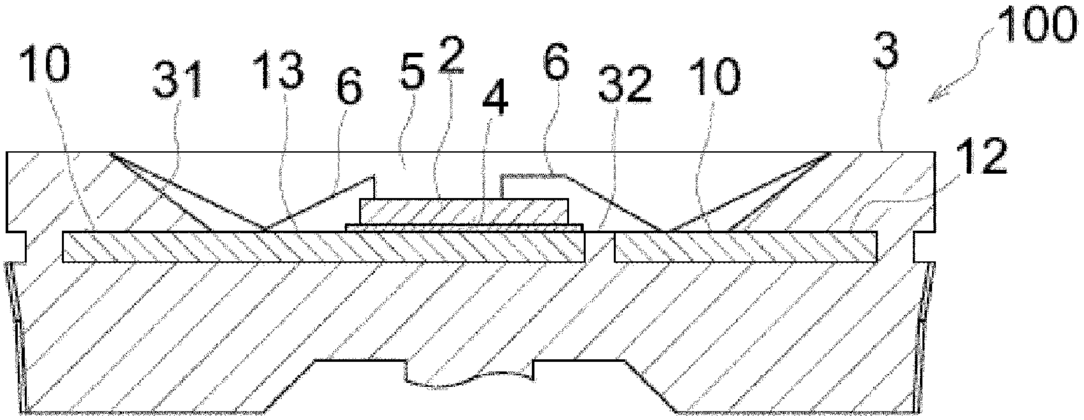
FIG. 1B is a schematic cross-sectional view of the optical semiconductor device according to the embodiment taken along the line X-X of FIG. 1A.

FIG. 1A and FIG. 1B schematically show the structure of an optical semiconductor device 100 of a first embodiment. The optical semiconductor device 100 of the present embodiment includes a light-emitting element 2 having a rectangular shape in a plan view, a pair of lead frames 10 (hereinafter also simply referred to as “lead frames 10”) constituted of a plate-shaped metal structure 1 for an optical semiconductor device, and a resin-molded body 3 in which a portion of the lead frames 10 is embedded.

The resin-molded body 3 can be made of a resin composite containing a thermoplastic resin or a thermosetting resin. The resin-molded body 3 can contain a filler such as $TiO_2$, which will be described below, mixed in the resin composite. The filler may be a reflective material adapted to reflect light emitted from the light-emitting element 2. The resin-molded body 3 has a recess having a bottom surface and lateral surfaces. The bottom surface of the recess is defined by a portion of the pair of lead frames 10, and the lateral surfaces of the recess is formed by a lateral wall portion 31 that serves as reflection surfaces inclined at predetermined angles. The gap between the pair of lead frames 10 is filled with the resin composite constituting the resin-molded body 3 to constitute a portion 32 of the bottom surface of the resin-molded body 3. The resin-molded body 3 of the present embodiment is longer in the lateral direction in a plan view. A portion of each of the pair of plate-shaped lead frames 10 is exposed on outer surfaces of the resin-molded body 3 to serve as external terminals, and the external terminals are bent along the lower surface of the resin-molded body 3. The light-emitting element 2 is mounted on one of the lead frames 10 constituting the bottom surface of the recess. The light-emitting element 2 is covered with a sealing member 5. The sealing member 5 contains, for example, a sealing material and a phosphor adapted to convert wavelength of light emitted from the light-emitting element 2. The material of the sealing member 5 preferably contains a light-transmissive resin. The phosphor is adapted to be excited by light emitted from the light-emitting element 2 and, to convert wavelength of the light emitted from the light-emitting element 2, and to emit with at least one peak emission wavelength within a predetermined wavelength range. The light-emitting element 2 includes a pair of positive and negative electrodes each of which is electrically connected to a corresponding one of the pair of lead frames 10 by wires 6. When electricity is supplied from an external device through the pair of lead frames 10, light can be emitted from the optical semiconductor device 100. The lead frames 10 or a base body constituted of the metal structure for an optical semiconductor device described in an embodiment described below includes, for example, portions that are in contact with a member, such as the resin-molded body 3 and the sealing member 5, made of a resin material. In this case, a package including the metal structure 1 for an optical semiconductor device and the resin-molded body 3 constitutes the present embodiment, the metal structure 1 for an optical semiconductor device constituting the lead frames 10 or the base body. In the package, adhesion between the metal structure 1 for an optical semiconductor device constituting the lead frames 10 or the base body and the resin-molded body 3 has been improved. Details of the metal structure 1 for an optical semiconductor device constituting the lead frames 10 or the base body will be described below. In the present specification, the resin material refers to a material containing at least a resin. Examples of the resin material include a resin composite containing resin.

The lead frames 10 constituted of the metal structure 1 for an optical semiconductor device function as a mounting member on which the light-emitting element 2 is mounted, a reflection member that reflects light emitted from the light-emitting element 2, and an electrically-conductive member electrically connected to the light-emitting element 2. Further, the lead frames 10 may also function as a heat dissipation member that dissipates heat generated from the light-emitting element 2. The lead frames 10 constituted of the metal structure 1 for an optical semiconductor device may be disposed below the light-emitting element 2 as in the first embodiment or may have the shape of a reflector surrounding the light-emitting element 2. The lead frames 10 may be plate-shaped lead frames.

Further, the metal structure 1 for an optical semiconductor device includes an outermost layer 1*d* made of gold, silver, a gold alloy, or a silver alloy immersed in and/or applied with a solution containing a polyallylamine polymer, which provides good adhesion to resin, so that adhesion to, for example, the sealing member 5 and the resin-molded body 3 in the optical semiconductor device 100 can be increased. The outermost layer 1*d* may be formed by a known surface treatment without specific limitations, such as plating (electroplating, electroless plating, hot dipping, sputtering, and vapor deposition including physical vapor deposition and chemical vapor deposition) and thermal spraying. In general, in an optical semiconductor device, the content of a filler such as $TiO_2$ in the resin-molded body may be increased in order to increase the reflectance of the resin-molded body to increase the total luminous flux, or the content of a phosphor in the sealing member may be increased to improve the color rendering properties. Addition of a large amount of such an impurity to a resin material tends to cause reduction in the adhesion between the lead frames and the resin material in the optical semiconductor device. On the other hand, in the optical semiconductor device 100 of the present embodiment, adhesion between the resin material and the lead frames 10 constituted of the metal structure 1 for an optical semiconductor device is increased, so that, in a step of solder-reflow mounting the optical semiconductor device

100 employing the lead frames 10 on a printed circuit board, solder can be prevented from entering the optical semiconductor device 100, and the sealing material can be prevented from leaking out of the resin-molded body 3, even in the case in which the content of impurities such as titanium oxide and a phosphor) in the resin material is increased. Details of the solution containing a polyallylamine polymer will be described below.

The metal structure 1 for an optical semiconductor device includes the outermost layer 1*d* made of gold, silver, a gold alloy, or a silver alloy immersed in and/or applied with the solution containing a polyallylamine polymer. Therefore, even in the case in which outermost layer is a silver or silver alloy plating layer, discoloration due to sulfurization or oxidation can be reduced to inhibit reduction in the luminous flux resulting from discoloration due to sulfurization or oxidation, so that a high luminous flux can be retained.

Second Embodiment: (First) Metal Structure for Optical Semiconductor Device

The metal structure 1 for an optical semiconductor device can be used for a lead frame or a base body. The metal structure 1 for an optical semiconductor device can be formed on an insulating board to serve as wirings, which allows for being used for a printed circuit board or a ceramic board. The base body in the present disclosure is a member that can include the metal structure 1 for an optical semiconductor device. Examples of the base body include a lead frame, a metal plate, a wire, a ceramic board, a printed circuit board, a flexible board, a silicon wafer, a GaAs wafer, a GaN wafer, a ceramic component such as a capacitor provided with metal terminals, an organic component such as a resistor provided with metal terminals, a pin connector, a circular connector, a socket, a connector provided with resin, and an airtight component such as a stem for a laser.

Figure 2A:
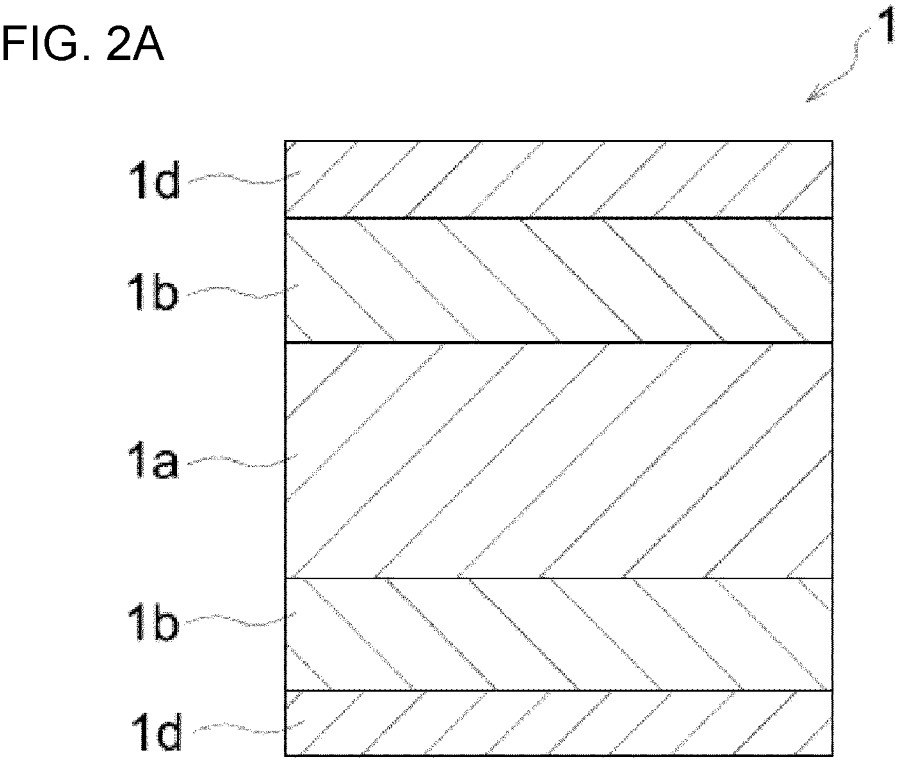
FIG. 2A is a schematic partial cross-sectional view of a metal structure for an optical semiconductor device according to an embodiment.

FIG. 2A is a schematic cross-sectional view showing an embodiment of the metal structure 1 for an optical semiconductor device.

The metal structure 1 for an optical semiconductor device can include at least one selected from the group consisting of a nickel or nickel alloy plating layer, a palladium or palladium alloy plating layer, a rhodium or rhodium alloy plating layer, and a platinum or platinum alloy plating layer between the outermost layer and a base member 1*a*.

The metal structure 1 for an optical semiconductor device can include, for example, the electrically-conductive base member 1*a* that contains copper or a copper alloy, nickel or nickel alloy plating layers 1*b*, and the outermost layers 1*d* made of gold, silver, a gold alloy, or a silver alloy immersed in and/or applied with the solution containing a poly allylamine polymer in this order, such that each nickel or nickel alloy plating layer 1*b* and each outermost layer 1*d* are disposed on each of a pair of surfaces opposite to each other with respect to the electrically-conductive base member 1*a*, as shown in FIG. 2A.

To increase reliability by improving die bondability, wire bondability, and solderability of the light-emitting element 2, the metal structure 1 for an optical semiconductor device includes the outermost layer made of gold, silver, a gold alloy, or a silver alloy, Gold and silver have smaller Vickers hardnesses, or softer, than nickel, palladium, rhodium, and platinum, which facilitates die bonding or wire bonding of the light-emitting element 2. Also, gold and silver are noble metals and are less apt to be oxidized than nickel, palladium, rhodium, and platinum, so that the effect on soldering is small.

In the case in which the outermost layer of the metal structure 1 for an optical semiconductor device is a gold or gold alloy layer, a gold or gold alloy plating layer is preferably formed as the outermost layer 1*d*. In the case in which the outermost layer 1*d* is a silver or silver alloy layer, it is preferable to form a silver or silver alloy plating layer as the outermost layer 1*d* and to form a gold or gold alloy plating layer 1*c*2 as an undercoating layer for the silver or silver alloy plating layer. This is because gold is a more stable metal than silver. That is, in the case in which the outermost layer 1*d* is a silver or silver alloy layer, the gold or gold alloy plating layer 1*c*2 may be included between the nickel or nickel alloy plating layer 1*b* and the outermost layer 1*d*.

Details of the outermost layer 1*d* made of gold, silver, a gold alloy, or a silver alloy will be described below.

The pair of opposite surfaces of the plate-shaped base member 1*a* may be an upper surface and a bottom surface, and the other two opposite surfaces of the plate-shaped base member 1*a* may be lateral surfaces.

The outermost layer 1*d* made of gold, silver, a gold alloy, or a silver alloy does not necessarily cover the entire surfaces of the metal structure 1 for an optical semiconductor device. That is, the outermost layer 1*d* made of gold, silver, a gold alloy, or a silver alloy constitutes at least a portion of a surface of the metal structure 1 for an optical semiconductor device. For example, in the lead frames 10, while a first embedded portion 12 embedded in the lateral wall 31 of the resin-molded body 3 and a second embedded portion 13 in intimate contact with the sealing member 5, which are not exposed on the bottom surface of the recess of the resin-molded body 3 shown in FIG. 1, preferably include, at their surfaces, the outermost layer 1*d* made of gold, silver, a gold alloy, or a silver alloy immersed in and/or applied with the solution containing a polyallylamine polymer in view of adhesion to resin, the external terminals exposed from the resin-molded body 3 and a mounting portion exposed on the bottom surface side of the optical semiconductor device may not include, at their surfaces, the outermost layer 1*d* made of gold, silver, a gold alloy, or a silver alloy. To provide the outermost layer 1*d* made of gold, silver, a gold alloy, or a silver alloy on a portion of the metal structure 1 for an optical semiconductor device as described above, a portion on which the outermost layer 1*d* made of gold, silver, a gold alloy, or a silver alloy is not needed to be disposed can be masked with a protective tape or the like when the outermost layer 1*d* made of gold, silver, a gold alloy, or a silver alloy is formed, and the outermost layer 1*d* made of gold, silver, a gold alloy, so that a silver alloy can be formed on a portion of the surface.

In a portion not in direct contact with the resin-molded body 3 or the sealing member 5, the outermost layer 1*d* made of gold, silver, a gold alloy, or a silver alloy immersed in and/or applied with the solution containing a polyallylamine polymer may be disposed on both of a pair of opposite surfaces, such as the upper surface and the bottom surface, of the plate-shaped metal structure 1 for an optical semiconductor device as in the present embodiment or may be disposed only on a surface and not provided on the other surfaces. Also, this may be disposed on a portion of a single surface. The outermost layer 1*d* made of gold, silver, a gold alloy, or a silver alloy immersed in and/or applied with the solution containing a polyallylamine polymer may have a uniform thickness over the entire region occupied by the outermost layer 1*d*, or may have varied thickness. With the varied thickness, the costs can be more effectively reduced. For example, the outermost layers 1*d* made of gold, silver, a gold alloy, or a silver alloy immersed in and/or applied with the solution containing a polyallylamine polymer may be disposed on the upper surface and the bottom surface of the metal structure 1 for an optical semiconductor device, and a thickness of the outermost layer 1*d* on one side may be greater than that of the outermost layer 1*d* on the other surface. With the outermost layer 1*d* made of gold, silver, a gold alloy, or a silver alloy, which is immersed in and/or applied with the solution containing a polyallylamine polymer, and disposed in a portion in direct and intimate contact with the resin-molded body 3 or the sealing member 5, for example, when the optical semiconductor device 100 is solder-reflow mounted on a printed circuit board, the entry of solder into the optical semiconductor device 100 can be more effectively inhibited.

[Base Member 1*a*]

The metal structure 1 for an optical semiconductor device includes the base member 1*a* provided with the outermost layer 1*d* made of gold, silver, a gold alloy, or a silver alloy immersed in and/or applied with the solution containing a polyallylamine polymer. In the present embodiment, the base member 1*a* is used as a material that defines the approximate shape of the metal structure 1 for an optical semiconductor device.

Any appropriate material may be used for the base member 1*a*, and copper, iron, alloys of these metals, and clad materials (such as a laminate of copper/iron-nickel alloy/copper) or the like can be preferably used for the base member 1*a*. In the case in which a copper alloy is employed, an alloy of copper and a metal such as iron, tin, and nickel can be employed. The copper content in this case is preferably 77.5 mass % or more and 99.5 mass % or less. In the case in which an iron alloy is employed, an alloy of iron and a metal such as nickel and cobalt can be employed. The iron content in this case is preferably 55.0 mass % or more and 99.9 mass % or less. Copper and copper alloys has good heat dissipation performance, and thus are preferable. In particular, plate-shaped members of copper and copper alloys also have good mechanical characteristics, electrical characteristics, and processability, and thus are preferable. The coefficient of linear expansion of a clad material is low, leading to increase in reliability of the optical semiconductor device 100.

The thickness, shape, and the like of the base member 1*a* can be variously selected according to the shape of the optical semiconductor device 100 and the like. For example, the shape of a plate, block, or film can be employed. Further, a wiring pattern formed on ceramic by printing or the like may be employed, and the formed wiring pattern may be plated with copper or a copper alloy.

To increase the light reflectance of the metal structure 1 for an optical semiconductor device, the flatness of the base member 1*a* is preferably as high as possible. For example, a surface roughness Ra of the base member 1*a* is preferably 0.5 μm or less. This structure allows for further increasing the flatnesses of the nickel or nickel alloy plating layer 1*b*, which is disposed on the base member 1*a* when necessary, a noble metal plating layer 1*c*1, which is disposed when necessary and constituted of a palladium or palladium alloy plating layer, a rhodium or rhodium alloy plating layer, a platinum or platinum alloy plating layer, or the like, and the outermost layer 1*d* made of gold, silver, a gold alloy, or a silver alloy. Also, a high flatness of the base member 1*a* allows for increasing the flatness of the outermost layer 1*d* with a thickness of 0.01 μm or more and 0.5 μm or less made of gold, silver, a gold alloy, or a silver alloy, and preferably increasing the reflectance of the metal structure 1 for an optical semiconductor device. The flatness of the base member 1*a* can be increased by treatment such as rolling, physical polishing, and chemical polishing or by plating with the same type of material as the material constituting the base member 1*a*. For example, in the case in which the base member 1*a* is made of a copper alloy, plating with a copper alloy can be performed to increase the flatness of the base member 1*a*.

[Nickel or Nickel Alloy Plating Layer 1*b*]

The metal structure 1 for an optical semiconductor device of the present embodiment preferably includes the nickel or nickel alloy plating layer 1*b* on the base member 1*a*.

The thickness of the nickel or nickel alloy plating layer 1*b* is preferably 0.5 μm or more and 10 μm or less, more preferably 1 μm or more and 10 μm or less. The thickness of the nickel or nickel alloy plating layer 1*b* of 0.5 μm or more allows for further effectively reducing diffusion of metal contained in the base member 1*a* from the base member 1*a* into the noble metal plating layer 1*c*1, which is an undercoating layer constituted of a palladium or palladium alloy plating layer, a rhodium or rhodium alloy plating layer, a platinum or platinum alloy plating layer, or the like and the outermost layer 1*d* made of gold, silver, a gold alloy, or a silver alloy. With the thickness of the nickel or nickel alloy plating layer 1*b* of 10 μm or less, materials and manufacturing cost can be reduced. Examples of the material of the nickel or nickel alloy plating layer 1*b* include nickel, a nickel-phosphorus alloy, a nickel-tin alloy, and a nickel-cobalt alloy. In the case in which a nickel alloy is employed, the nickel content is preferably 90.0 mass % or more and 99.0 mass % or less.

Third Embodiment: (Second) Metal Structure for Optical Semiconductor Device

Figure 2B:
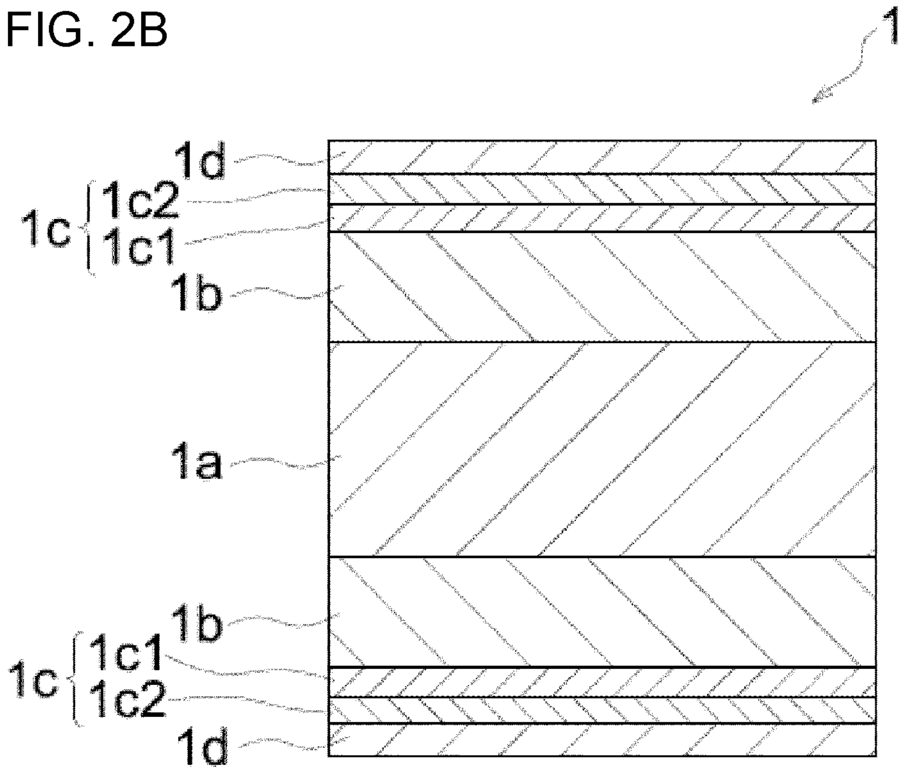
FIG. 2B is a schematic partial cross-sectional view of a metal structure for an optical semiconductor device according to another embodiment.

FIG. 2B is a schematic cross-sectional view of another embodiment of the metal structure 1 for an optical semiconductor device. The metal structure 1 for an optical semiconductor device may include an undercoating layer 1*c* between the nickel or nickel alloy plating layer 1*b* and the outermost layer 1*d* made of gold, silver, a gold alloy, or a silver alloy. The undercoating layer 1*c* preferably includes the noble metal plating layer 1*c*1 constituted of a palladium or palladium alloy plating layer, a rhodium or rhodium alloy plating layer, a platinum or platinum alloy plating layer, or the like.

The metal structure 1 for an optical semiconductor device can include, for example, the nickel or nickel alloy plating layers 1*b* and the outermost layers 1*d*, which are made of gold, silver, a gold alloy, or a silver alloy immersed in and/or applied with the solution containing a polyallylamine polymer, such that each nickel or nickel alloy plating layer 1*b* and each outermost layer 1*d* are layered in this order on each of a pair of surfaces opposite to each other with respect to the base member 1*a*, as shown in FIG. 2B. In FIG. 2B, the metal structure 1 for an optical semiconductor device further includes the noble metal plating layer 1*c*1 constituted of a palladium or palladium alloy plating layer, a rhodium or rhodium alloy plating layer, a platinum or platinum alloy plating layer, or the like between the nickel or nickel alloy plating layer 1*b* and the outermost layer 1*d* made of gold, silver, a gold alloy, or a silver alloy described above. That is, in the metal structure 1 for an optical semiconductor device, the base member 1*a*, the nickel or nickel alloy plating layer 1*b*, the noble metal plating layer 1*c*1 constituted of a palladium or palladium alloy plating layer, a rhodium or rhodium alloy plating layer, a platinum or platinum alloy plating layer, or the like, and the outermost layer 1*d* made of gold, silver, a gold alloy, or a silver alloy immersed in and/or applied with the solution containing a polyallylamine polymer are layered in this order. The metal structure 1 for an optical semiconductor device may include, for example, the nickel or nickel alloy plating layers 1*b*, the noble metal plating layers 1*c*1 provided when necessary and constituted of a palladium or palladium alloy plating layer, a rhodium or rhodium alloy plating layer, a platinum or platinum alloy plating layer, or the like, and the outermost layers 1*d* made of gold, silver, a gold alloy, or a silver alloy immersed in and/or applied with the solution containing a polyallylamine polymer, such that each nickel or nickel alloy plating layer 1*b*, each noble metal plating layer 1*c*1, and each outermost layer 1*d* are layered in this order on each of two pairs of opposite surfaces with respect to the plate-shaped base member 1*a* to surround the base member 1*a*.

As described above, to increase reliability by improving die bondability, wire bondability, and solderability of the light-emitting element 2, the metal structure 1 for an optical semiconductor device includes the outermost layer made of gold, silver, a gold alloy, or a silver alloy. In the case in which the outermost layer of the metal structure 1 for an optical semiconductor device is a gold or gold alloy layer, a gold or gold alloy plating layer is preferably formed as the outermost layer 1*d*. In the case in which the outermost layer 1*d* is a silver or silver alloy layer, it is preferable to form a silver or silver alloy plating layer as the outermost layer 1*d* and to form the gold or gold alloy plating layer 1*c*2 as an undercoating layer for the silver or silver alloy plating layer.

The undercoating layer c may be constituted of the noble metal plating layer 1*d* described above alone or the gold or gold alloy plating layer 1*c*2 alone. The gold or gold alloy plating layer 1*c*2 may be disposed on the noble metal plating layer 1*c*1 such that the combination of the noble metal plating layer 1*c*1 and the gold or gold alloy plating layer 1*c*2 serves as the undercoating layer 1*c*.

[Noble Metal Plating Layer 1*c*1 Constituted of Palladium or Palladium Alloy Plating Layer, Rhodium or Rhodium Alloy Plating Layer, Platinum or Platinum Alloy Plating Layer, or the Like]

The metal structure 1 for an optical semiconductor device of the present embodiment preferably includes the noble metal plating layer 1*c*1 constituted of a palladium or palladium alloy plating layer, a rhodium or rhodium alloy plating layer, a platinum or platinum alloy plating layer, or the like as the undercoating layer in contact with the nickel or nickel alloy plating layer 1*b*. In the case in which a base member 1*a* made of a material containing copper is used, it is preferable to dispose the nickel or nickel alloy plating layer 1*b* on the base member 1*a*, dispose the noble metal plating layer 1*c*1 constituted of a palladium or palladium alloy plating layer, a rhodium or rhodium alloy plating layer, a platinum or platinum alloy plating layer, or the like thereon as a second undercoating layer, and dispose the outermost layer 1*d* made of gold, silver, a gold alloy, or a silver alloy to form layers layered in this order. With such a structure, in the case in which, for example, the base member 1*a* contains copper, diffusion of copper contained in the base member 1*a* into the outermost layer 1*d* made of gold, silver, a gold alloy, or a silver alloy can be further reduced, so that adhesion between the layers can be increased. Also, further reduction in diffusion of copper contained in the base member 1*a* allows for further improving wire bondability in the case in which the metal structure 1 for an optical semiconductor device is used as the lead frames 10.

The thickness of the noble metal plating layer 1*c*1 is preferably 0.01 μm or more and 0.3 μm or less, more preferably 0.02 μm or more and 0.2 μm or less, further preferably 0.03 μm or more and 0.1 μm or less. The thickness of the noble metal plating layer 1*c*1 of 0.01 μm or more and 0.3 μm or less allows for further reducing diffusion of metal contained in the base member 1*a* into the outermost layer 1*d*, which is the outermost layer made of gold, silver, a gold alloy, or a silver alloy, so that wire bondability can be further improved in the case in which the metal structure 1 for an optical semiconductor device is used as the lead frames 10. Examples of the material of the palladium or palladium alloy plating layer include palladium, alloys thereof with nickel, phosphorus, cobalt, copper, etc. In the case in which a palladium alloy is employed, the palladium content is preferably 75.0 mass % or more and 97.0 mass % or less. Examples of the material of the rhodium or rhodium alloy plating layer include rhodium, alloys thereof with nickel, cobalt, platinum, etc. In the case in which a rhodium alloy is employed, the rhodium content is preferably 75.0 mass % or more and 99.0 mass % or less. Examples of the material of the platinum or platinum alloy plating layer other than include platinum, alloys thereof with nickel, cobalt, copper, etc. In the case in which a platinum alloy is employed, the platinum content is preferably 75.0 mass % or more and 99.0 mass % or less.

The noble metal plating layer which is the undercoating layer for the outermost layer 1*d* made of gold, silver, a gold alloy, or a silver alloy, may have both of the function of preventing sulfurization and the function of preventing diffusion of metal contained in the base member 1*a* into other layers. This allows for further reducing the costs. For example, gold does not easily react with sulfur components and has a strong effect of preventing diffusion of metal contained in the base member 1*a*, and thus is preferable.

Figure 3A:
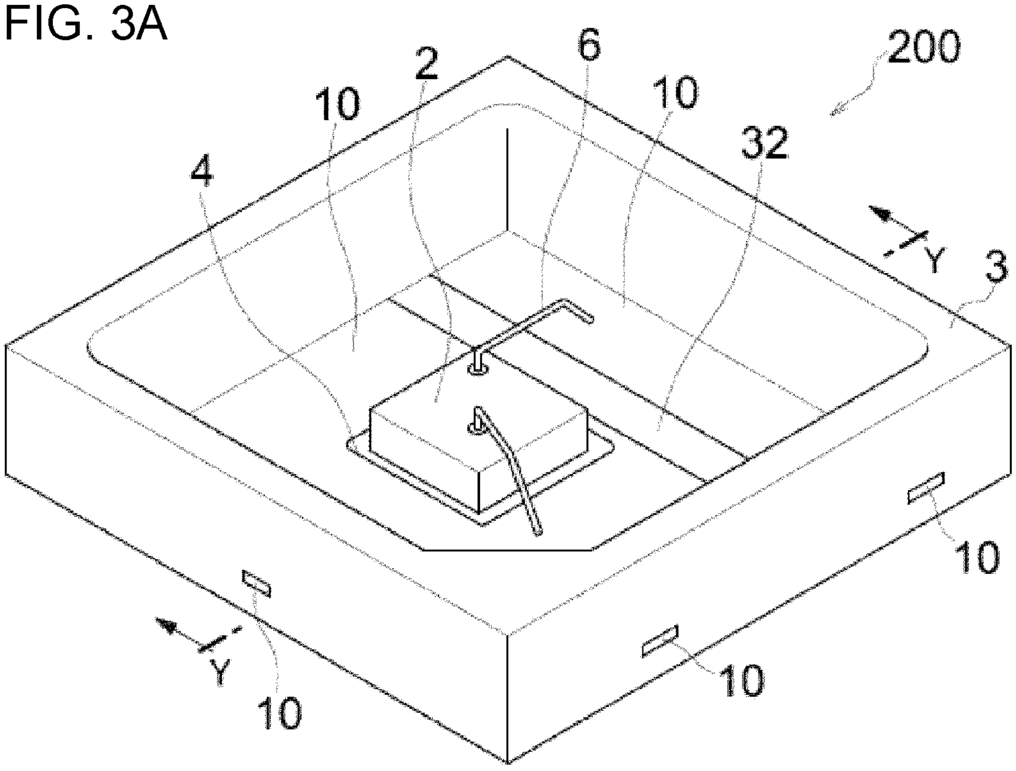
FIG. 3A is a schematic perspective view of an optical semiconductor device according to another embodiment.
Figure 3B:
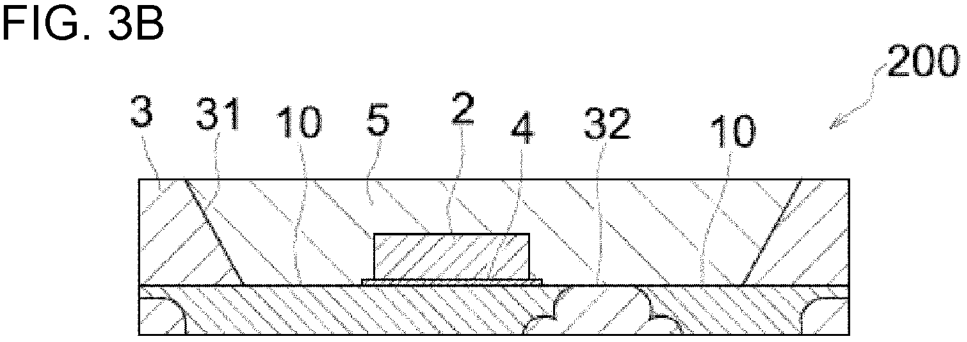
FIG. 3B is a schematic cross-sectional view of the optical semiconductor device according to the other embodiment taken along the line Y-Y of FIG. 3A.

The metal structure 1 for an optical semiconductor device is preferably, for example, the substantially flat plate-shaped lead frames 10 as shown in FIGS. 3A and 3B described below. This allows for increasing the reliability of the metal structure 1 for an optical semiconductor device as the reflective member. The nickel or nickel alloy plating layer 1*b* is somewhat fragile compared with copper, iron, alloys of these metals, and clad materials (such as a laminate of copper/iron-nickel alloy/copper) used for the base member 1*a*. Therefore, the metal structure 1 for an optical semiconductor device including the nickel or nickel alloy plating layer 1*b* is preferably used in the form of a flat plate without being bent.

Fourth Embodiment: (Second) Optical Semiconductor Device

FIG. 3A and FIG. 3B schematically show the structure of an optical semiconductor device 200 of a fourth embodiment. The optical semiconductor device 200 of the present embodiment includes lead frames 10 that do not include bent portions. As for the optical semiconductor device 200 of the fourth embodiment, common members with the optical semiconductor device 100 of the first embodiment are indicated by the same reference numerals.

Next, members constituting the optical semiconductor device 100 of the first embodiment and the optical semiconductor device 200 of the fourth embodiment is described.

[Light-Emitting Element 2]

A semiconductor light-emitting element with appropriate wavelengths can be selected for the light-emitting element 2. For example, a light-emitting element 2 configured to emit blue or green light can employ a nitride semiconductor such as InGaN, GaN, and AlGaN or GaP. For a red-light emitting element, GaAlAs or AlInGaP can be used. A light-emitting element 2 made of other materials can also be used. The composition, emission color, size, and/or the number of the light-emitting elements 2 to be used can be appropriately selected according to the purpose.

In the case in which the optical semiconductor device 100 or the optical semiconductor device 200 includes a member adapted to perform wavelength conversion, a nitride semiconductor is preferable, which is configured to emit light with short wavelengths that can efficiently excite the member adapted to perform wavelength conversion. The emission wavelengths can be variously selected by varying the materials for the semiconductor layer and their mixing ratio. Also, examples of the light-emitting element 2 include not only the light-emitting element 2 configured to emit light in the visible light range but also the light-emitting element 2 configured to emit ultraviolet light or infrared light.

The light-emitting element 2 is preferably mounted on the lead frame 10 constituted of the metal structure 1 for an optical semiconductor device. This allows for further improving the light extraction efficiency of the optical semiconductor device 100 or the optical semiconductor device 200.

The light-emitting element 2 preferably includes the positive and negative electrodes each electrically connected to a respective electrically-conductive member. The positive and negative electrodes may be disposed on one surface side or on both of the upper and lower surfaces of the light-emitting element 2. Connection to the electrically-conductive member may be established by using a bonding member 4 and the wires 6 described below or by flip-chip mounting.

[Resin-Molded Body 3]

The resin-molded body 3 is a member made of a resin composite and holds the pair of lead frames 10 in an integrated manner. The resin-molded body 3 may have a substantially rectangular shape in which a pair of opposite sides are longer than the other opposite sides in a plan view as shown in FIG. 1A, or may have a quadrangular shape as shown in FIG. 3A. Alternatively, the resin-molded body 3 may have a polygonal shape or a shape made by combining polygons. In the case in which the resin-molded body 3 defines the recess, the lateral wall 31 defining the recess may have an inner lateral surface inclined at an angle with respect to the bottom surface as shown in FIG. 3B, may be substantially perpendicular to the bottom surface, or may have a stepped surface. The height and the shape of the opening can also be appropriately selected according to the purpose and the intended use. The lead frames 10 are preferably located inside the recess. The gap between the pair of lead frames 10 is preferably filled with the resin composite constituting the resin-molded body 3 to constitute the portion 32 of the bottom surface of the resin-molded body 3.

The resin-molded body 3 may be made of a resin composite containing a thermosetting resin or a thermoplastic resin. A resin composite containing a thermosetting resin is particularly preferably used. For the composite containing a thermosetting resin, a resin having a lower gas permeability than a resin used for the sealing member 5 is preferably used. Specific examples of the composite include epoxy resin composites, silicone resin composites, modified epoxy resin composites such as silicone-modified epoxy resins, modified silicone resin composites such as epoxy-modified silicone resins, polyimide resin composites, modified polyimide resin composites, urethane resins, and modified urethane resin composites. For the composite containing a thermoplastic resin, a resin that has a low viscosity and is apt to flow is preferably used. Specific examples of the resin include polyamides, polyphthalamide (PPA), polycarbonate resins, poly(phenylene sulfide) (PPS), liquid crystal polymers (LCP), acrylonitrile-butadiene-styrene copolymer resins (ABS resins), phenolic resins, acrylic resins, and poly-butylene terephthalate) resins (PBT resins). The resin composite constituting the resin-molded body 3 may contain particles of at least one inorganic substance selected from among $TiO_2$, $SiO_2$, $Al_2O_3$, MgO, $MgCO_3$, $CaCO_3$, $Mg(OH)_2$, $Ca(OH)_2$, and the like as a filler. Incorporating the inorganic particles as a filler in the resin composite constituting the resin-molded body 3 allows for adjusting the transmittance of light of the resin-molded body 3. In the case in which the amount of $TiO_2$, which is a white component, is increased (such as the case in which the $TiO_2$ content is adjusted to 20 mass % or more and 60 mass % or less when the total amount of the resin composite is regarded as 100 mass %) to increase the reflectance of the resin material in order to increase the total luminous flux of the light-emitting device, adhesion between the metal structure 1 for an optical semiconductor device and the resin material may be reduced. However, in the present embodiment, adhesion between the base body (such as the lead frames 10 and the board) including an outermost layer made of gold, silver, a gold alloy, or a silver alloy and the resin material can be increased even in such a case.

A member other than the resin-molded body 3 made of an inorganic substance such as ceramic, glass, and metal may hold the lead frames 10. This allows the optical semiconductor device 100 or the optical semiconductor device 200 to be highly reliable and less susceptible to deterioration.

[Bonding Member 4]

The bonding member 4 fixes and mounts the light-emitting element 2 on the lead frame 10. As the material of an electrically-conductive bonding member 4, for example, an electrically-conductive paste containing at least one of silver, gold, and palladium, a eutectic solder material such as gold-tin solder and tin-silver-copper solder, a brazing filler metal such as a low-melting-point metal, particles of copper, silver, or gold, or the substantially the same material as the material of the outermost layer 1*d* made of gold, silver, a gold alloy, or a silver alloy can be used. As an insulating bonding member 4, an epoxy resin composite, a silicone resin composite, a polyimide resin composite, a modified or hybrid resin of these resins, or the like can be used. In the case in which such a resin is used, a metal layer having a high reflectance, such as an aluminum film and a silver film, or a dielectric reflective film can be disposed on the mounting surface of the light-emitting element 2 in consideration of deterioration due to light and heat generated from the light-emitting element 2.

[Sealing Member 5]

The sealing member 5 covers the light-emitting element 2, the lead frames 10, the wires 6, and a protective film described below. In the optical semiconductor device 100 or the optical semiconductor device 200, with the sealing member 5, the covered members can be protected against dust, water, external forces, and the like, so that the reliability of the optical semiconductor device can be increased. In particular, with the sealing member 5 being disposed on the protective film after the protective film is formed, the protective film can be protected, so that the reliability of the optical semiconductor device is increased.

It is preferable that the sealing member 5 have light transmissivity to transmit light emitted from the light-emitting element 2 and have resistance to the light such that the sealing member 5 is not easily deteriorated by the light. Specific examples of a material used for the sealing member 5 include insulating resin composites having light transmissivity to transmit light emitted from the light-emitting element, such as silicone resin composites, modified silicone resin composites, modified epoxy resin composites, and fluorocarbon resin composites. In particular, a hybrid resin containing at least one of dimethyl silicone, phenyl silicone with a low phenyl content, and a resin, such as a fluorine-based silicone resin, having the siloxane skeleton as the base can also be used.

In the case in which the material constituting the sealing member 5 contains resin, the sealing member 5 can be formed using a potting (dropping) technique, a compression molding technique, a printing technique, a transfer molding technique, a jet-dispensing technique, or a spray application. A potting technique is preferable in the case in which the optical semiconductor device includes the resin-molded body 3 defining the recess, and a compression molding technique or a transfer molding technique is preferable in the case in which the optical semiconductor device includes a flat plate-shaped base body.

The sealing member 5 preferably fills the recess of the resin-molded body 3 as shown in FIG. 1B or FIG. 3B.

The shape of the outer surface of the sealing member 5 can be variously selected according to required light distribution characteristics of the optical semiconductor device 100. For example, with the upper surface having a convex lens shape, a concave lens shape, a Fresnel lens shape, a rough surface, or the like, the directivity and light extraction efficiency of the optical semiconductor device can be adjusted.

The sealing member 5 may also contain a colorant, a light-diffusing material, a light reflective material, various fillers, a wavelength conversion member, etc.

The wavelength conversion member is a material adapted to convert a wavelength of light emitted from the light-emitting element 2. In the case in which the light emitted from the light-emitting element 2 is blue, an yttrium-aluminum-garnet phosphor (hereinafter referred to as "YAG:Ce"), which is one of aluminum oxide phosphors, is preferably used for the wavelength conversion member. With a YAG:Ce phosphor adapted to absorb a portion of blue light emitted from the light-emitting element and to emit yellow light being complementary color, a high-power optical semiconductor device configured to emit white mixed light can be relatively easily produced.

[Wires 6]

The wires 6 connect the light-emitting element 2 and an electrically-conductive member such as the lead frames 10. Examples of a material preferably used for the wires 6 include gold, silver, aluminum, copper, and alloys of these metals. Also, a member that has a core and a covering layer made of a material different from a material of the core and disposed on the core, such as a member that has a copper core and a covering layer of palladium or a palladium-gold alloy disposed on the surface of the copper core, can be used for the wires 6. Among the materials described above, the material of the wires 6 is preferably one selected from among gold, silver, and silver alloys, which have high reliability. Silver or a silver alloy, which has high light reflectance, is particularly preferable. In this case, it is particularly preferable that the wires 6 are covered with the protective film. This structure allows for further preventing sulfurization and disconnection of wires containing silver, so that the reliability of the optical semiconductor device 100 can be further increased. In the case in which the base member 1*a* of the metal structure for an optical semiconductor device constituting the lead frames 10 contains copper and the wires 6 are made of silver or a silver alloy, the nickel or nickel alloy plating layer 1*b* provided in the metal structure 1 for an optical semiconductor device allows for reducing formation of a local cell between copper and silver. This allows for further reducing deterioration of the lead frames 10 and the wires 6, so that a more reliable optical semiconductor device can be provided. Further, as in the lead frames 10 including the metal structure 1 for an optical semiconductor device described above, the wires 6 may include the metal structure 1 for an optical semiconductor device. With the outermost layer 1*d* immersed in and/or applied with the solution containing a polyallylamine polymer, good adhesion to resin is obtained, so that adhesion to, for example, the sealing member 5 in the optical semiconductor device 100 or the optical semiconductor device 200 can be increased.

[Protective Film]

The optical semiconductor device 100 or the optical semiconductor device 200 may further include a protective film. The protective film can cover at least the outermost layer 1*d* made of gold, silver, a gold alloy, or a silver alloy and provided at the surface of the metal structure 1 for an optical semiconductor device constituting the lead frames 10. The protective film is a member that mainly reduces discoloration or corrosion of the outermost layer 1*d* made of gold, silver, a gold alloy, or a silver alloy and provided at the surface of the metal structure 1 for an optical semiconductor device constituting the lead frames 10. The protective film may further cover, optionally, surfaces of members other than the lead frames 10 and the base body, such as the light-emitting element 2, the bonding member 4, and the resin-molded body 3, and a surface of the metal structure 1 for an optical semiconductor device not provided with the outermost layer 1*d* made of gold, silver, a gold alloy, or a silver alloy. In the case in which the wires 6 are made of silver or a silver alloy or the case in which the outermost layer 1*d* made of gold, silver, a gold alloy, or a silver alloy is a silver or silver alloy layer, the protective film preferably covers the wires 6 and the outermost layer 1*d*. This structure allows for further preventing sulfurization and disconnection of wires containing silver, so that the reliability of the optical semiconductor device 100 or the optical semiconductor device 200 can be further increased.

The protective film is preferably formed by sputtering, chemical vapor deposition, or atomic layer deposition (ALD). In particular, using ALD allows for forming highly uniform protective film that is more dense than a protective film obtained by other methods, so that, for example, sulfurization and discoloration of the outermost layer 1*d* of the metal structure 1 for an optical semiconductor device constituting the lead frames 10 can be highly effectively prevented.

Examples of the material of the protective film include oxides such as $Al_2O_3$, $SiO_2$, $TiO_2$, $ZrO_2$, ZnO, $Nb_2O_5$, MgO, $In_2O_3$, $Ta_2O_5$, $HfO_2$, SeO, $Y_2O_3$, and $SnO_2$, nitrides such as AlN, TiN, and ZrN, and fluorides such as $ZnF_2$ and $SrF_2$. These materials may be used singly or may be used in a mixture. Alternatively, these materials may be layered.

The optical semiconductor device 100 or the optical semiconductor device 200 can include various members in addition to the members described above. For example, a Zener diode can be mounted as a protective element.

[Method of Manufacturing Optical Semiconductor Device]

Next, a method of manufacturing the optical semiconductor device 200 of the fourth embodiment will be described as an example of a method of manufacturing an optical semiconductor device on the basis of FIGS. 4A, 4B, 4C, 4D.

Figure 4A:
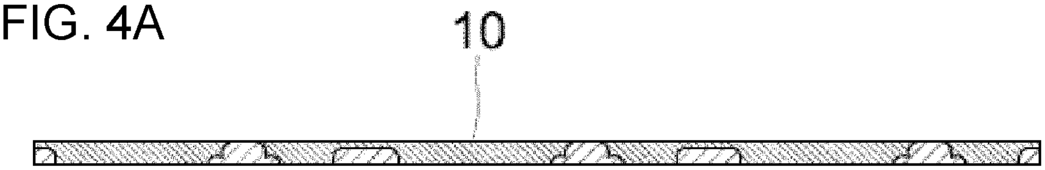
FIG. 4A is a schematic cross-sectional view showing a manufacturing step to illustrate a method of manufacturing an optical semiconductor device.

Lead frames 10 constituted of the metal structures 1 for optical semiconductor devices of the second or third embodiment are provided as shown in FIG. 4A. Specifically, for example, a copper metal plate to constitute the base member 1*a* of the metal structure 1 for an optical semiconductor device is punched, the nickel or nickel alloy plating layer 1*b* provided when necessary, the noble metal plating layer 1*c*1, provided when necessary and constituted of a palladium or palladium alloy plating layer, a rhodium or rhodium alloy plating layer, a platinum or platinum alloy plating layer, or the like, and the outermost layer 1*d* made of gold, silver, a gold alloy, or a silver alloy are formed, treatment of immersing in and/or applying the solution containing a polyallylamine polymer is performed, and washing with water or hot water (washing) performed when necessary, and dried to obtain the lead frames 10, as will be described below regarding a method of manufacturing the metal structure 1 for an optical semiconductor device.

Figure 4B:
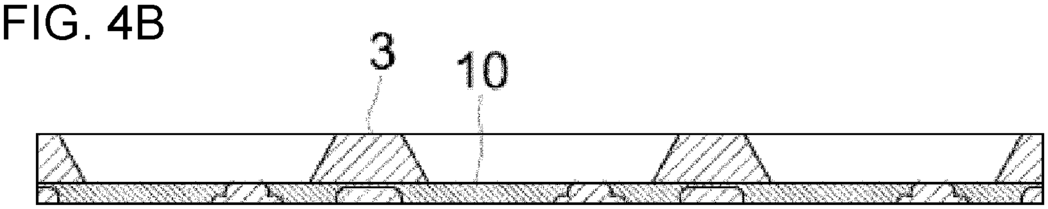
FIG. 4B is a schematic cross-sectional view showing a manufacturing step to illustrate the method of manufacturing an optical semiconductor device.

The resin-molded body 3 can be formed using a transfer molding technique so as to be in contact with the lead frames 10 that use the metal structure 1 for an optical semiconductor device as shown in FIG. 4B. The resin-molded body 3 can be formed such that a pair of lead frames 10 are exposed on the bottom surface of the recess of each resin-molded body 3. That is, the lead frames 10 can be exposed on the bottom surfaces of the recesses of respective resin-molded bodies 3.

Figure 4C:
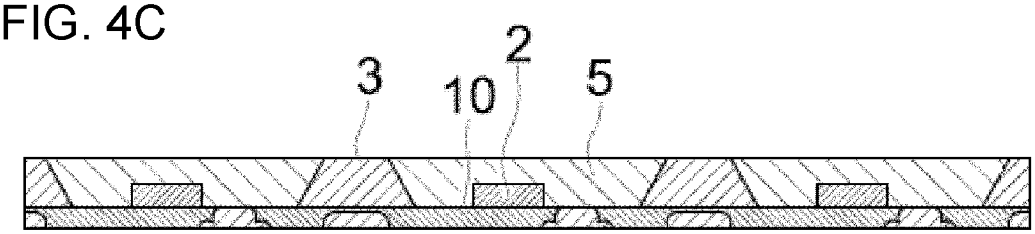
FIG. 4C is a schematic cross-sectional view showing a manufacturing step to illustrate the method of manufacturing an optical semiconductor device.

Next, each light-emitting element 2 can be mounted via the bonding member 4 in a region for mounting the light-emitting element 2 on the lead frame 10 on which the resin-molded body 3 has been formed, as shown in FIG. 4C. The light-emitting element 2 can be then connected to the lead frames 10 by wires. After that, the sealing member 5 can be disposed in the recess of each resin-molded body 3.

Figure 4D:
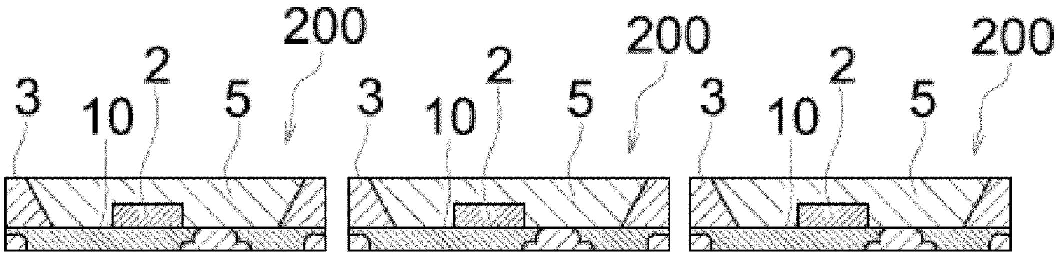
FIG. 4D is a schematic cross-sectional view showing a manufacturing step to illustrate the method of manufacturing an optical semiconductor device.

The lead frame 10 and the resin-molded body 3 as shown in FIG. 4D are then cut with a dicing saw or the like to perform sin elation into individual optical semiconductor devices as shown in FIG. 3A and FIG. 3B. This cutting causes a cross-section of the lead frame 10 to be exposed on an outer lateral surface of the optical semiconductor device 200. In this cross-section, the base member 1*a* made of copper or the like of the metal structure 1 for an optical semiconductor device constituting the lead frame 10, the nickel or nickel alloy plating layer 1*b* provided when necessary, the noble metal plating layer 1*c*1, provided when necessary and constituted of a palladium or palladium alloy plating layer, a rhodium or rhodium alloy plating layer, a platinum or platinum alloy plating layer, or the like, and further the outermost layer 1*d* made of gold, silver, a gold alloy, or a silver alloy immersed in and/or applied with the solution containing a polyallylamine polymer are exposed.

Fifth Embodiment: Method of Manufacturing Metal Structure for Optical Semiconductor Device Next, a method of manufacturing a metal structure for an optical semiconductor device will be described.

A method of manufacturing the metal structure for an optical semiconductor device of the first embodiment includes a treatment step (1) including immersing in and/or applying the solution containing a polyallylamine polymer a base body, the base body including an outermost layer (the outermost layer 1*d* made of gold, silver, a gold alloy, or a silver alloy) at a portion or entire surfaces of the base body, the outermost layer including a plating of at least one selected from the group consisting of gold, silver, a gold alloy, and a silver alloy (preferably plating of at least one selected from the group consisting of gold, silver, a gold alloy, and a silver alloy).

In the present disclosure, plating refers to, for example, a metal film formed by wet plating such as electroplating and electroless plating or dry plating such as hot dipping, sputtering, and vapor deposition including physical vapor deposition and chemical vapor deposition.

It is sufficient that the base body has the outermost layer including at least one selected from the group consisting of gold, silver, a gold alloy, and a silver alloy, and the outermost layer may not be a metal film formed by surface treatment. In other words, the base body may be made of at least one selected from the group consisting of gold, silver, a gold alloy, and a silver alloy.

A stepped portion may be formed at a predetermined position of the base body by wet etching, and the step described above may be performed after the stepped portion is formed.

As described above, the nickel or nickel alloy plating layer 1*b* and the noble metal plating layer 1*c*1 constituted of a palladium or palladium alloy plating layer, a rhodium or rhodium alloy plating layer, a platinum or platinum alloy plating layer, or the like are preferably formed on the base member 1*a* when necessary. Accordingly, it is preferable to include a step of forming the nickel or nickel alloy plating layer 1*b* on the base member 1*a*, performed when necessary, a step of forming the noble metal plating layer 1*c*1 constituted of a palladium or palladium alloy plating layer, a rhodium or rhodium alloy plating layer, a platinum or platinum alloy plating layer, or the like on the nickel or nickel alloy plating layer 1*b*, performed when necessary, and a step of forming the outermost layer 1*d* made of gold, silver, a gold alloy, or a silver alloy, the step of forming the nickel or nickel alloy plating layer 1*b*, the step of forming the noble metal plating layer 1*c*1, the step of forming the outermost layer 1*d* performed before performing Step (1) described above. As described above, in the case in which the outermost layer is a silver or silver alloy layer, it is preferable to form the gold or gold alloy plating layer 1*c*2 on the noble metal plating layer 1*c*1 described above and form the silver or silver alloy layer thereon. Accordingly, in the case in which the outermost layer is a silver or silver alloy layer, the step of forming the outermost layer 1*d* made of gold, silver, a gold alloy, or a silver alloy preferably includes forming the gold or gold alloy plating layer and forming the silver or silver alloy outermost layer. The thickness of the gold or gold alloy plating layer 1*c*2 can be 0.003 μm or more and 0.5 μm or less. The outermost layer 1*d* is not necessarily a plating but may be a metal film formed by thermal spraying. Formation of these layers is preferably performed using a technique of forming a metal film by plating described above, which facilitate formation of the layers, more preferably electroplating or electroless plating. In particular, electroplating can form the layer at an increased speed, which increases mass-productivity, and thus is preferable.

Pretreatment of the base member 1*a* can be performed before the layers described above are formed. Examples of the pretreatment include acid treatment with an acid such as dilute sulfuric acid, dilute nitric acid, and dilute hydrochloric acid and alkali treatment with a base such as sodium hydroxide. Such treatment may be performed once or a plurality of times, or the same treatment or different treatments may be combined. In the case in which pretreatment is performed a plurality of times, washing with pure running water is preferably performed after each treatment. In the case in which the base member 1*a* is a metal plate made of copper or a copper alloy, dilute sulfuric acid is preferably used for pretreatment. In the case in which the base member 1*a* is a metal plate made of iron or an iron alloy, dilute hydrochloric acid is preferably used for pretreatment.

In the step of forming the nickel or nickel alloy plating layer 1*b*, when the material constituting the plating layer is pure nickel, the plating layer can be formed by electroplating using, for example, a plating solution containing nickel sulfamate. When a nickel-phosphorus alloy is used, the plating layer can be formed by electroless plating using a nickel hypophosphite plating solution.

In the step of forming the noble metal plating layer 1*c*1 constituted of a palladium or palladium alloy plating layer, a rhodium or rhodium alloy plating layer, a platinum or platinum alloy plating layer, or the like, in the case in which the material constituting the plating layer is palladium or a palladium alloy, the plating layer can be formed by electroplating using, for example, a plating solution containing tetraanimninepalladium chloride. In the case in which the material constituting the plating layer is rhodium or a rhodium alloy, the plating layer can be formed by electroplating using, for example, a plating solution containing rhodium sulfate. In the case in which the material constituting the plating layer is platinum or a platinum alloy, the plating layer can be formed by electroplating using, for example, a plating solution containing a dinitrodiamine platinum salt.

[Outermost Layer 1*d* Made of Gold, Silver, Gold Alloy, or Silver Alloy]

The outermost layer 1*d* made of gold, silver, a gold alloy, or a silver alloy is located at the surface of the metal structure 1 for an optical semiconductor device. The thickness of the outermost layer 1*d* made of gold, silver, a gold alloy, or a silver alloy is 0.003 μm or more and 0.5 μm or less, preferably 0.01 μm or more and 0.3 μm or less. With the thickness of the outermost layer 1*d* made of gold, silver, a gold alloy, or a silver alloy of 0.003 μm or more, die bondability of the light-emitting element 2 and wire bondability with the wires 6 can be further improved. With the thickness of the outermost layer 1*d* made of gold, silver, a gold alloy, or a silver alloy of 0.5 μm or less, the amount of noble metal, which is expensive, to be used can be further reduced, so that the costs can be further reduced. In the case in which a gold alloy is employed, the gold content is preferably 75.0 mass % or more and 99.9 mass % or less, in the case in which a silver alloy is employed, the silver content is preferably 75.0 mass % or more and 99.9 mass % or less.

When the outermost layer 1*d* is a gold or gold alloy layer and when the gold or gold alloy layer is formed by electroplating, a plating solution to be used preferably contains gold potassium cyanide or gold cyanide at a gold metal concentration of 0.5 g/L or more and 10 g/L or less and a conducting salt at 30 g/L or more and 150 g/L, or less. In the case of gold alloy plating, a gold-silver alloy plating or gold-copper alloy plating layer can be obtained by adding 1 g/L or more and 5 g/L or less of, for example, silver potassium cyanide or copper potassium cyanide, respectively, as an alloying metal.

When the outermost layer 1*d* is a silver or silver alloy layer and when the silver or silver alloy layer is formed by electroplating, a plating solution to be used preferably contains 20 g/L or more and 80 g/L or less of silver potassium cyanide or silver cyanide as silver metal and 50 g/L or more and 150 g/L or less of free potassium cyanide or a conducting salt. Also, a selenium compound or an organic sulfur compound can be added as a brightener to this plating solution. In the case of silver alloy plating, a silver-gold alloy plating or silver-copper alloy plating layer can be obtained by adding 5 g/L or more and 20 g/L or less of, for example, gold potassium cyanide or copper potassium cyanide, respectively, as an alloying metal.

The plating solution preferably contains 5 g/L or more and 150 g/L or less of one or more conducting salts such as cyanide, carbonate, phosphate, nitrate, citrate, and sulfate. With the amount of 5 g/L or more and 150 g/L or less of the conducting salt contained in the plating solution, the plating solution does not have an excessively high electric resistance or an excessively high viscosity, and ionic mobility is not likely to decrease, so that the plating solution can be used industrially more stably. With the amount of 5 g/L or more and 150 g/L or less of the conducting salt contained in the plating solution, the plating solution does not have an excessively high viscosity, which can reduce what is called drag-out of the plating solution by the object of plating, so that plating with gold, silver, a gold alloy, or a silver alloy can be more economically performed. Examples of the cyanide include potassium cyanide and sodium cyanide. Examples of the carbonate include potassium carbonate, sodium carbonate, and ammonium carbonate. Examples of the phosphate include potassium phosphate, sodium phosphate, ammonium phosphate, and potassium pyrophosphate. Examples of the nitrate include potassium nitrate, sodium nitrate, and ammonium nitrate. Examples of the citrate include potassium citrate, sodium citrate, and ammonium citrate. Examples of the sulfate include potassium sulfate and sodium sulfate.

In the step of forming the outermost layer 1*d* made of gold, silver, a gold alloy, or a silver alloy, it is preferable to perform electroplating using the above plating solution and a soluble electrode made of gold, silver, or a gold-silver alloy or a stainless steel, platinum, or platinum-coated titanium electrode as the anode under the conditions of a temperature of the plating solution of 20° C. or more and 70° C. or less, a cathode current density of the electrically-conductive base body of 0.1 $A/dm^2$ or more and 10 $A/dm^2$ or less, and a plating time of 5 seconds or more and 10 minutes or less.

In the case in which the gold, silver, gold alloy, or silver alloy layer serving as the outermost layer 1*d* is, for example, a metal plate or a wire instead of being a metal film formed by plating or thermal spraying, the member can be formed or provided by an usual method.

The outermost layer 1*d* made of gold, silver, a gold alloy, or a silver alloy is immersed in and/or applied with the solution containing a polyallylamine polymer. A film containing the polyallylamine polymer thus adheres to the base body including the outermost layer 1*d* made of gold, silver, a gold alloy, or a silver alloy. The thickness of the film containing the polyallylamine polymer is preferably 10 nm or more and 500 nm or less. With the thickness of the film containing the polyallylamine polymer of 500 nm or less, die bonding, wire bonding, or soldering of the light-emitting element can be further improved. With the thickness of the film containing the polyallylamine polymer of 10 nm or more, adhesion between the metal structure 1 for an optical semiconductor device and the resin material can be further increased.

The polyallylamine polymer is not limited to a particular polymer but is usually assumed to be a homopolymer of allylamine, which is a primary amine. A specific example is the polyallylamine polymer represented by General Formula (1):

[Formula 1]

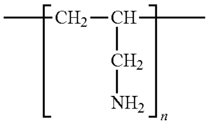

[where n is 25 to 440]. Such polyallylamine polymers can be used singly, or two or more of such polyallylamine polymers can be used in combination.

The weight-average molecular weight of the polyallylamine polymer is preferably 1,600 or more and 25,000 or less, more preferably 3,000 or more and 18,000 or less, in view of adhesion to the resin material.

A known or commercially-available product can be used for such a polyallylamine polymer, or the polyallylamine polymer can be prepared by polymerization. In the case in which a commercially-available product is used, a polymer named PAA (registered trademark) from Nittobo Medical Co., Ltd. is on the market and is easily available.

This polyallylamine polymer is soluble in water, and aqueous solutions with various concentrations can be prepared. In particular, with the total amount of the solution containing a polyallylamine polymer being 100 mass %, an aqueous solution with a concentration of 0.01 mass % or more and 1.0 mass % or less is preferable, and an aqueous solution with a concentration of 0.05 mass % or more and 0.5 mass % is more preferable, in view of economy and ease of operation. With the concentration of the solution containing a polyallylamine polymer is 0.01 mass % or more, adhesion to the outermost layer 1*d* made of gold, silver, a gold alloy, or a silver alloy is made more sufficient, and improvement in adhesion to the resin material can be facilitated. Adjusting the concentration of the solution containing a polyallylamine polymer to 1.0 mass % or less allows for not only improving adhesion to the resin material but also preventing the viscosity of the aqueous solution from being excessively high. Accordingly, the treatment solution is not likely to be dragged out together with the metal structure 1 for an optical semiconductor device, which is more economical.

In the present embodiment, the solution containing a polyallylamine polymer may contain a triazine compound. That is, the film containing a polyallylamine polymer adhering to the base body may contain a triazine compound. Containing both of a polyallylamine polymer and a triazine compound allows for further improving adhesion to the resin material. Adhesion of a triazine compound to gold is good, so that the triazine compound increases adhesion to the resin material particularly in the case in which a gold or gold alloy layer is employed as the outermost layer 1*d*.

The triazine compound is preferably a triazine thiol compound to further facilitate improvement in adhesion to the resin material. In particular, examples of the triazine compound include the triazine compound represented by General Formula (2):

[Formula 2]

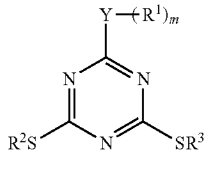

[where Y represents a nitrogen atom or a sulfur atom. $R^1$, $R^2$, and $R^3$ are the same or different from each other and each represent a hydrogen atom, an alkali metal atom, or a substituted or unsubstituted alkyl group. m is 1 or 2; m is 2 in the case in which Y represents a nitrogen atom, and m is 1 in the case in which Y represents a sulfur atom].

Examples of the alkali metal atom represented by $R^1$, $R^2$, or $R^3$ in General Formula (2) include a lithium atom, a sodium atom, a potassium atom, and a cesium atom.

Examples of the alkyl group represented by $R^1$, $R^2$, or $R^3$ in General Formula (2) include an alkyl group with 1 to 10 (particularly 1 to 6) carbon atoms such as a methyl group, an ethyl group, an n-propyl group, an isopropyl group, an n-butyl group, an isobutyl group, a sec-butyl group, and a tert-butyl group. Such an alkyl group may have one to three substituents such as halogen atoms (including chlorine atoms, bromine atoms, and iodine atoms).

Specific examples of such a triazine compound include:

[Formula 3]

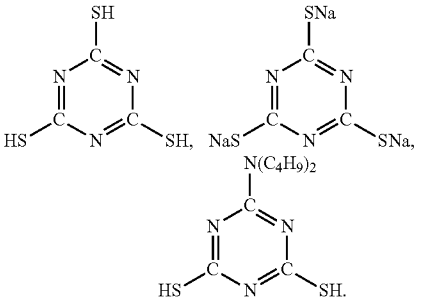

These triazine compounds can be used singly, or two or more of these triazine compounds can be used in combination.

A known or commercially-available product can be used for such a triazine compound. For example, 1,3,5-triazine-2,4,6-thiol sodium salt is on the market from Sankyo Kasei Co., Ltd. under the commercial name of Santhiol and is easily available. Santhiol is soluble in water, which enables preparation of a treatment solution with an appropriate concentration, and thus is preferable.

In the case in which the solution containing a polyallylamine polymer further contains a triazine compound, with the total amount of the solution containing a polyallylamine polymer being 100 mass %, the triazine compound content in an aqueous solution is preferably 0.01 mass or more and 1.0 mass % or less, more preferably 0.05 mass % or more and 0.5 mass % or less, in view of economy and ease of operation. Having the concentration of the solution containing a triazine compound of 0.01 mass % or more allows for more sufficiently adhering to the outermost layer 1*d* made of gold, silver, a gold alloy, or a silver alloy and facilitating improvement in adhesion to the resin material. Adjusting the concentration of the solution containing a triazine compound to 1.0 mass % or less allows for not only improving adhesion to the resin material but also preventing the viscosity of the aqueous solution from being excessively high. Accordingly, the treatment solution is not likely to be dragged out together with the metal structure 1 for an optical semiconductor device, which is more economical.

A triazine compound has high adhesion to gold and silver (particularly gold). In particular, a triazine thiol compound has high adhesion to gold because of intermolecular forces between gold and S (sulfur), but such an effect may be reduced by washing with water. On the other hand, a polyallylamine polymer has a high molecular weight, and the solution containing a polyallylamine polymer is viscous, and thus is apt to adhere to the surface of the outermost layer 1*d* made of gold, silver, a gold alloy, or a silver alloy through the treatment of the present embodiment to form the film containing a polyallylamine polymer. The film containing a polyallylamine polymer allows for improving adhesion between the outermost layer 1*d* made of gold, silver, a gold alloy, or a silver alloy and the resin material. In the case in which the film containing a polyallylamine polymer contains a triazine compound, the film containing a polyallylamine polymer retains the triazine compound, which is assumed to have better effects on improvement in adhesion.

An appropriate anionic surfactant, cationic surfactant, or nonionic surfactant can be added to the solution containing a polyallylamine polymer in order to facilitate improvement in wettability of the outermost layer 1*d* made of gold, silver, a gold alloy, or a silver alloy and solution stability.

An appropriate organic solvent or an appropriate pH buffer can be added to the solution containing a polyallylamine polymer to facilitate retention of solution stability. Examples of the pH buffer include boric acid and its salts, diphosphoric acid and its salts, phosphoric acid and its salts, and citric acid and its salts.

In the case in which a concentrate is prepared and used in a treatment device as the solution containing a polyallylamine polymer, the concentrate may be diluted with water appropriately.

The solution containing a polyallylamine polymer is particularly useful for increasing adhesion between the lead frames 10 and the adjacent resin-molded body 3 in the optical semiconductor device 100 or the optical semiconductor device 200.

To treat a gold, silver, gold alloy, or silver alloy layer with the solution containing a polyallylamine polymer, immersion and/or application is preferably performed. In the case of performing immersion, the gold, silver, gold alloy, or silver alloy layer may be entirely immersed in the solution containing a polyallylamine polymer, or only a portion to be brought into contact with the resin material may be immersed. In the case of performing immersion, appropriate stirring or jet treatment is preferably performed. On the other hand, in the case of performing application (particularly spraying), applying the solution containing a polyallylamine polymer may be performed using a known method, or spraying (such as spraying with a sprayer) may be performed using a known method. Specifically, spraying may be performed perpendicularly to, horizontally with respect to, or at an angle to the gold, silver, gold alloy, or silver alloy layer with a sprayer. Alternatively, jet spraying may be performed, or sprinkling like a shower may be performed. The immersion and the application may be both performed, and these may be performed in any appropriate order.

When the gold, silver, gold alloy, or silver alloy layer is subjected to immersion and/or application, the temperature of the solution containing a polyallylamine polymer is preferably 15° C. or more and 50° C. or less. With the temperature of the solution of 15° C. or more, a film of a polyallylamine polymer, and a film of a triazine compound when necessary, can adhere to the surface of the gold, silver, gold alloy, or silver alloy layer in an appropriate period of time. With the temperature of the solution of 50° C. or less, formation of spots at the time of drying is more likely to be reduced.

The length of time in which the gold, silver, gold alloy, or silver alloy layer is immersed in and/or applied with the solution containing a poly allylamine polymer can be appropriately adjusted according to a method of immersion and/or application and the temperature of the treatment solution and is preferably three seconds or more and 60 second or less in general. With the treatment time of three seconds or more, a film of a polyallylamine polymer, and a film of a triazine compound, which is provided when necessary, is facilitated to more uniformly adhere to the surface of the gold, silver, gold alloy, or silver alloy layer. With the treatment time of 60 seconds or less, improvement in productivity is facilitated.

The manufacturing method of the present embodiment can include, after Step (1) is performed as described above, Step (2) of washing the base body that has undergone Step (1) and Step (3) of drying the base body that has undergone Step (2), which are performed in this order. The washing (particularly washing with water or hot water) and the drying can be performed using usual methods.

After forming each layer, a step of heat-treating the metal structure 1 for an optical semiconductor device as Step (4) may be included. Specifically, after Step (3) described above, Step (4) of heat-treating the base body that has undergone Step (2) may be included. The heat treatment may be performed in the atmosphere, an inert atmosphere such as nitrogen gas, or a reducing atmosphere such as hydrogen gas. The heat treatment may be performed in a batch such as in a hot-air thermostat or may be continuously performed using an air-heating furnace or an infrared furnace provided in the last stage of a continuous plating apparatus. Such heat treatment allows metals in the base member 1*a* and the layers to counter-diffuse appropriately, facilitating improvement in adhesion between the base member 1*a* and the nickel or nickel alloy plating layer 1*b* and adhesion between the layers 1*b*, 1*c*, and 1*d*. The temperature and the treatment time of the heat treatment can be determined in consideration of the combination of thicknesses of the layers, and the heat-treatment temperature is preferably 100° C. or more and 500° C. or less in ordinary cases.

EXAMPLES

The following specifically describes the present invention on the basis of examples, but the present invention is not limited to these examples.

Examples 1, 4, 5, 7, and 11

On each of surfaces of a base member 1*a* as will be described below, a nickel plating layer, a nickel-tin alloy plating layer, or a nickel-cobalt alloy plating layer was formed as the nickel or nickel alloy plating layer 1*b*, and a gold plating layer was formed thereon as the outermost layer 1*d* in this order, by electroplating using plating solutions of bath compositions below under respective conditions to form a metal structure 1 for an optical semiconductor device as shown in FIG. 2A. After that, the step of immersion in or spraying of a solution containing a polyallylamine polymer, the step of washing, and the step of drying were performed to prepare lead frames 10, which were a pair of lead frames, using the metal structure 1 for an optical semiconductor device. Table 1 shows the thicknesses (μm) of the layers, the compositions of solutions containing a polyallylamine polymer, and treatment conditions in examples.

Base Member 1*a* in Examples 4, 5, 7, and 11

As the base member, copper was used in Examples 1, 4, 5, and 7, and iron was used in Example 11.

Copper base member: TAMAC194 manufactured by Mitsubishi Shindoh Co., Ltd. formed into the shape of lead frames with a press die was used.

Iron base member: SPCE-SB manufactured by Nippon Steel Corporation formed into the shape of lead frames with a press die was used.

Nickel or Nickel Alloy Plating Layer 1*b* in Examples 1, 4, 5, 7, and 11

As the nickel or nickel alloy plating layer 1*b*, a nickel plating layer was formed in each of Examples 1, 4, and 11, a nickel-tin alloy plating layer was formed in Example 5, and a nickel-cobalt alloy plating layer was formed in Example 7.

The nickel plating layer was formed using a standard sulfamate electroplating bath using a plating solution of the following bath composition.

Nickel Plating Solution
- Nickel sulfamate=450 g/L
- Nickel chloride=10 g/L
- Boric acid=30 g/L
- pH 4.0

For the nickel-tin alloy plating layer, a plating solution prepared by adding an appropriate amount (5 g/L) of tin sulfamate to that of the nickel plating layer described above was used.

For the nickel-cobalt alloy plating layer, a plating solution prepared by adding an appropriate amount (15 g/L) of cobalt sulfamate to that of the nickel plating layer described above was used.

The nickel plating layer, the nickel-tin alloy plating layer, or the nickel-cobalt alloy plating layer was formed by electroplating using the plating solution described above with an adjusted plating time at a solution temperature of 55° C. at a cathode current density of 5 A/$dm^2$. A sulfur-added nickel plate was used as the anode.

[Outermost Layer 1*d* in Examples 1, 4, 5, 7, and 11]

Gold Plating Solution
- Gold potassium cyanide: 9 g/L in terms of gold
- Potassium citrate=120 g/L
- Dipotassium phosphate=30 g/L
- Thallium sulfate: 10 mg/L in terms of thallium
- pH 6.3

The gold plating layer was formed by electroplating using the above plating solution with an adjusted plating time at a solution temperature of 68° C. at a cathode current density of 0.5 A/$dm^2$. An insoluble platinum-coated titanium electrode was used as the anode.

After that, in each of Examples 1, 4, and 7, immersion in or spraying with an aqueous solution containing 0.5 mass % of the polyallylamine polymer PAA-03 (registered trademark; with a weight-average molecular weight of 3,000) manufactured by Nittobo Medical Co., Ltd. was performed, and washing with water and then drying were performed. Table 1 shows immersion or spraying conditions.

In Example 5, spraying with an aqueous solution containing 0.02 mass % of the polyallylamine polymer PAA-08 (registered trademark; with a weight-average molecular weight of 8,000) manufactured by Nittobo Medical Co., Ltd, and 0.2 mass % of 1,3,5-triazine-2,4,6-thiol trisodium salt (Santhiol N-W manufactured by Sankyo Kasei Co., Ltd.) was performed at 50° C. for 35 seconds, and washing with water and then drying were performed.

In Example 11, immersion in an aqueous solution containing 0.01 mass % of the polyallylamine polymer PAA-15 (registered trademark; with a weight-average molecular weight of 15,000) manufactured by Nittobo Medical Co., Ltd. and 0.1 mass % of 1,3,5-triazine-2,4,6-thiol trisodium salt (Santhiol N-W manufactured by Sankyo Kasei Co., Ltd.) was performed at 15° C. for three seconds, and washing with water and then drying were performed.

Examples 2, 3, 6, 8, 9, and 10

On each of surfaces of a base member 1*a* below, a nickel plating layer or a nickel-phosphorus alloy plating layer was formed as the nickel or nickel alloy plating layer 1*b*, a palladium plating layer, a palladium-nickel alloy plating layer, a rhodium plating layer, or a rhodium-cobalt alloy plating layer was formed thereon as the undercoating layer 1*c*, and a gold plating layer, a gold-silver alloy plating layer, or a gold-cobalt plating layer was formed thereon as the outermost layer 1*d* in this order by electroplating using plating solutions of bath compositions that will be described below under respective conditions to form a metal structure 1 for an optical semiconductor device as shown in FIG. 2B. After that, the treatment step of immersion in a solution containing a poly allylamine polymer, the step of washing, and the step of drying were performed, and the step of heat-treating was performed, when necessary, to prepare lead frames 10, which were a pair of lead frames, using the metal structure 1 for an optical semiconductor device. Table 1 shows the thicknesses of the layers, the compositions of solutions containing a polyallylamine polymer, and treatment conditions in examples.

Base Member 1*a* in Examples 2, 3, 6, 8, 9, and 10

A copper base body was used in each of Examples 2, 3, 6, 8, and 10, and a 42-alloy base body was used in Example 9.

The copper base body used was the same as in Example 1.

42-alloy base body: a 42% Ni—Fe iron-nickel alloy (Fe-42% Ni) manufactured by Dowa Metanix Co., Ltd. formed into the shape of lead frames with a press die was used.

Nickel or Nickel Alloy Plating Layer 1*b* in Examples 2, 3, 6, 8, 9, and 10

As the nickel or nickel alloy plating layer 1*b*, a nickel plating layer was formed in each of Examples 2, 3, 6, 8, and 10, and a nickel-phosphorus alloy plating layer was formed in Example 9.

Substantially the same plating solutions as that in Example 1 were used for the nickel plating layers in Examples 2, 3, 6, 8, and 10 except that the plating thicknesses were adjusted to the thicknesses shown in Table 1.

For the nickel-phosphorus alloy plating layer, a plating solution prepared by adding an appropriate amount (20 g/L) of phosphorous acid to that of the nickel plating layer was used.

The nickel plating layer or the nickel-phosphorus alloy plating layer was formed by electroplating using the plating solution described above with an adjusted plating time at a solution temperature of 55° C. at a cathode current density of 5 A/dm$^2$. A sulfur-added nickel plate was used as the anode.

Undercoating Layer 1*c* in Examples 2, 3, 6, 8, 9, and 10

As the undercoating layer 1*c*, a palladium plating layer was formed in each of Examples 2, 9, and 10, a rhodium plating layer was formed in Example 3, a palladium-nickel alloy plating layer was formed in Example 6, and a rhodium-cobalt alloy plating layer was formed in Example 8.

For the palladium plating layer serving as the undercoating layer 1*c* in each of Examples 2, 9, and 10, a plating solution of the following bath composition was used.

Palladium Plating Solution

Tetraamminepalladium chloride: 5 g/L in terms of palladium

Ammonium nitrate=150 g/L

Sodium 3-pyridinesulfonate=5 g/L pH 8.5

For the palladium-nickel alloy plating layer in Example 6, a plating solution in which an appropriate amount (1.0 g/L) of nickel sulfate added to the palladium plating solution described above was used.

The palladium plating layer or the palladium-nickel alloy plating layer was formed by electroplating using the plating solution described above with an adjusted plating time at a solution temperature of 50° C. at a cathode current density of 1 A/dm$^2$. A platinum-coated titanium electrode was used as the anode.

For the rhodium plating layer serving as the undercoating layer 1*c* in Example 3, a plating solution of the bath composition described below was used.

Rhodium Plating Solution

Rhodium sulfate: 2 g/L in terms of rhodium

Sulfuric acid=50 g/L

Lead sulfate: 10 mg/L in terms of lead

For the rhodium-cobalt alloy plating layer in Example 8, a plating solution in which an appropriate amount (0.3 g/L) of cobalt sulfate was added to the above rhodium plating solution was used.

The rhodium plating layer was formed by electroplating using the plating solution described above with an adjusted plating time at a solution temperature of 45° C. at a cathode current density of 1 A/dm$^2$. A platinum-coated titanium electrode was used as the anode.

Outermost Layer 1*d* in Examples 2, 3, 6, 8, 9, and 10

As the outermost layer 1*d*, a gold-silver alloy plating layer was formed in Example 2, a gold plating layer was formed in each of Examples 3, 6, 8, and 10, and a gold-cobalt alloy plating layer was formed in Example 9.

For the gold-silver alloy plating layer 1*d* in Example 2, a plating solution of the following bath composition was used.

Gold-Silver Alloy Plating Solution 2

Gold potassium cyanide: 4.25 g/L in terms of gold

Silver potassium cyanide: 0.75 g/L in terms of silver (gold: 85 mass %, silver: 15 mass %)

Potassium cyanide=30 g/L

Potassium citrate=80 g/L

Potassium phosphate=50 g/L pH 9.5

The gold-silver alloy plating layer was formed by electroplating using the above plating solution with an adjusted plating time at a solution temperature of 30° C. at a cathode current density of 1 A/dm$^2$. A platinum-coated titanium electrode was used as the anode.

The gold plating layer serving as the outermost layer 1*d* in each of Examples 3, 6, 8, and 10 was formed using substantially the same plating solution as in Example 1 under substantially the same conditions as in Example 1 except that the plating time was adjusted such that the plating thicknesses shown in Table 1 were achieved.

The gold-cobalt alloy plating layer serving as the outermost layer 1*d* in Example 9 was formed under substantially the same conditions as in Example 1 except that the plating time was adjusted and that a plating solution in which an appropriate amount (1.0 g/L) of cobalt sulfate was added to the gold plating solution in Example 1 was used.

After that, in each of Examples 2 and 8, immersion in an aqueous solution containing 0.02 mass % of the polyallylamine polymer PAA-08 (registered trademark; with a weight-average molecular weight of 8,000) manufactured by Nittobo Medical Co., Ltd. and 0.2 mass % of 1,3,5-triazine-2,4,6-thiol trisodium salt (Santhiol N-W manufactured by Sankyo Kasei Co., Ltd.) was performed, and washing with water and then drying were performed. Table 1 shows immersion conditions.

In each of Examples 3, 6, and 9, immersion in an aqueous solution containing 0.01 mass % of the polyallylamine polymer PAA-15 (registered trademark; with a weight-average molecular weight of 15,000) manufactured by Nittobo Medical Co., Ltd. and 0.1 mass % of 1,3,5-triazine-2,4,6-thiol trisodium salt (Santhiol N-W manufactured by Sankyo Kasei Co., Ltd.) was performed, and washing with water and then drying were performed. In Example 9, heat treatment was further performed at 250° C. for two hours. Table 1 shows immersion conditions.

In Example 10, immersion in an aqueous solution containing 0.5 mass % of the polyallylamine polymer P AA-03 (registered trademark; with a weight-average molecular weight of 3,000) manufactured by Nittobo Medical Co., Ltd. was performed at 20° C. for 20 seconds, and washing with water, then drying, and heat-treating at 450° C. for five minutes were performed. Table 1 shows immersion conditions.

Comparative Examples 1, 2, and 3

In Comparative Example 1, a metal structure having substantially the same structure as in Example 1 and having thicknesses of the nickel plating layer and the gold plating layer shown in Table 1 was prepared but was not treated with a solution containing a polyallylamine polymer. In each of Comparative Examples 2 and 3, a metal structure having substantially the same structure as in Example 10 with a ratio of the thicknesses of the nickel plating layer, the palladium plating layer, and the gold plating layer shown in Table 1 was prepared but was not treated with a solution containing a polyallylamine polymer. Lead frames 10, which were a pair of lead frames, were prepared using this metal structure.

Optical Semiconductor Device

Next, optical semiconductor devices having substantially the same structure as the optical semiconductor device shown in FIGS. 1A and 1B were manufactured using the metal structures for an optical semiconductor device of the examples and the comparative examples as lead frames. Before the semiconductor devices 100 were singulated, each step was performed in a state of a collective body in which a plurality of resin-molded bodies 3 are molded with lead frames 10 in which a plurality of the pairs of lead frames 10 were connected to each other. However, a single optical semiconductor device 100 (singular) shown in FIGS. 1A and 1B will be described for convenience. Optical semiconductor devices of examples and comparative examples having substantially the same structure as the optical semiconductor device shown in FIGS. 1A and 1B were manufactured using the lead frames 10.

The resin-molded body 3 defined the recess, and the lead frames 10 were exposed in the bottom surface of the recess. A light-emitting element 2 having a rectangular shape in a plan view and including positive and negative electrodes on its upper surface was placed on the lead frames 10 and bonded using a light-transmissive resin as the bonding member 4. After that, a sealing material containing a YAG phosphor and a light-transmissive resin was dropped into the recess by potting to form a sealing member 5.

Occurrence of Entry of Solder into Resin-Molded Body 3 and Leakage of Sealing Member Out of Resin-Molded Body 3

The optical semiconductor devices of the examples and the comparative examples were each placed on a printed circuit board coated with a lead-free solder (Sn-0.3Ag-0.7Cu) paste, mounted at a reflow temperature of 260° C. for 10 seconds, and detached after the reflow. Under a stereoscopic microscope at 40-fold magnification, entry of the solder into the resin-molded body 3 was evaluated, and occurrence of leakage of the sealing member was also evaluated. Table 2 shows the evaluation results.

Total Luminous Flux Maintenance Factor After Sulfur Resistance Test

To evaluate reliability of resistance to sulfurization, the optical semiconductor devices in the examples and the comparative examples were exposed to a mixed gas containing 2 ppm of $H_2S$ and 4 ppm of $NO_2$ for 100 hours at a temperature of 40° C. and a relative humidity of 75%, and the total luminous flux of light emitted from the optical semiconductor device before and after the exposure was measured with a spectroscope equipped with an integrating sphere. The ratio determined by dividing the total luminous flux after the exposure by the total luminous flux before the exposure was measured as the maintenance factor of the total luminous flux. Table 2 shows the results.

TABLE 1

| | Manufacturing conditions | | | | | | | |
|---|---|---|---|---|---|---|---|---|
| | Type of base member 1a | Nickel or nickel alloy plating layer 1b | Pd, Pd alloy, Rh, Rh alloy, Pt, or Pt alloy plating layer 1c1 | Gold or gold alloy plating layer 1d | Composition of polyallylamine treatment solution | Temperature in polyallylamine treatment | Polyallylamine treatment lime | Heat treatment |
| Example 1 | Copper alloy 194 | Ni (2) | Absent | Au (0.2) | PAA-03 (0.5 mass %) | 40° C. | Immersion for 30 seconds | None |
| Example 2 | Copper alloy 194 | Ni (1) | Pd (0.02) | Au—Ag alloy (0.02) | PAA-08 (0.02 mass %) + Santhiol NW (0.2 mass %) | 30° C. | Immersion for 5 seconds | None |
| Example 3 | Copper alloy 194 | Ni (6) | Rh (0.03) | Au (0.04) | PAA-15 (0.01 mass %) + Santhiol NW (0.1 mass %) | 25° C. | Immersion for 15 seconds | None |
| Example 4 | Copper alloy 194 | Ni (10) | Absent | Au (0.06) | PAA-03 (0.5 mass %) | 30° C. | Immersion for 25 seconds | None |
| Example 5 | Copper alloy 194 | Ni—Sn alloy (2) | Absent | Au (0.3) | PAA-08 (0.02 mass %) + Santhiol NW (0.2 mass %) | 50° C. | Spraying for 35 seconds | None |
| Example 6 | Copper alloy 194 | Ni (1) | Pd—Ni alloy (0.05) | Au (0.01) | PAA-15 (0.01 mass %) + Santhiol NW (0.1 mass %) | 25° C. | Immersion for 45 seconds | None |
| Example 7 | Copper alloy 194 | Ni—Co alloy (2) | Absent | Au (0.4) | PAA-03 (0.5 mass %) | 25° C. | Spraying for 55 seconds | None |
| Example 8 | Copper alloy 194 | Ni (3) | Rh—Co alloy (0.02) | Au (0.3) | PAA-08 (0.02 mass %) + Santhiol NW (0.2 mass %) | 15° C. | Immersion for 60 seconds | None |
| Example 9 | 42-Alloy | NiP (2) | Pt (0.3) | Au—Co alloy (0.15) | PAA-15 (0.01 mass %) + Santhiol NW (0.1 mass %) | 25° C. | Immersion for 15 seconds | 250° C. × two hours |
| Example 10 | Copper alloy 194 | Ni (3) | Pd (0.01) | Au (0.03) | PAA-03 (0.5 mass %) | 20° C. | Immersion for 20 seconds | 450° C. × five minutes |
| Example 11 | Iron material | Ni (6) | Absent | Au (0.2) | PAA-15 (0.01 mass %) + Santhiol NW (0.1 mass %) | 15° C. | Immersion for three seconds | None |

TABLE 1-continued

| | Manufacturing conditions | | | | | | | |
|---|---|---|---|---|---|---|---|---|
| | Type of base member 1a | Nickel or nickel alloy plating layer 1b | Pd, Pd alloy, Rh, Rh alloy, Pt, or Pt alloy plating layer 1c1 | Gold or gold alloy plating layer 1d | Composition of polyallylamine treatment solution | Temperature in polyallylamine treatment | Polyallylamine treatment lime | Heat treatment |
| Comparative Example 1 | Copper alloy 194 | Ni (1) | Absent | Au (0.2) | None | None | None | None |
| Comparative Example 2 | Copper alloy 194 | Ni (2) | Pd (0.03) | Au (0.03) | None | None | None | None |
| Comparative Example 3 | Copper alloy 194 | Ni (2) | Pd (0.02) | Au (0.005) | None | None | None | None |
| | | Numbers in parentheses indicate plating thicknesses (μm). | Numbers in parentheses indicate plating thicknesses (μm). | Numbers in parentheses indicate plating thicknesses (μm). | | | | |

TABLE 2

| | Evaluation results | | |
|---|---|---|---|
| | Entry of solder into resin-molded body | Leakage of sealing resin in resin-molded body | Total luminous flux maintenance factor in sulfurization test (%) |
| Example 1 | No | No | 100 |
| Example 2 | No | No | 100 |
| Example 3 | No | No | 100 |
| Example 4 | No | No | 100 |
| Example 5 | No | No | 100 |
| Example 6 | No | No | 100 |
| Example 7 | No | No | 100 |
| Example 8 | No | No | 100 |
| Example 9 | No | No | 100 |
| Example 10 | No | No | 100 |
| Example 11 | No | No | 100 |
| Comparative Example 1 | Yes | Yes | 98 |
| Comparative Example 2 | Yes | Yes | 97 |
| Comparative Example 3 | Yes | Yes | 96 |

Examples 12 to 22 and Comparative Examples 4 to 6

In each of Examples 12 to 22 and Comparative Examples 4 to 6, similarly to the Examples 1 to 11 and Comparative Examples 1 to 3, respectively, a base member 1*a*, a nickel or nickel alloy plating layer 1*b*, and a noble metal plating layer 1*c*1 and/or a gold or gold alloy plating layer 1*c*2, provided when necessary, as the undercoating layer 1*c* were formed. As the outermost layer, a silver or silver alloy plating layer 1*d* was formed thereon using a silver plating solution below.

In each of Examples 12, 13, 15, 16, 17, 19, 20, and 22, a silver plating layer was formed as the outermost layer using the silver plating solution as will be described below.

[Silver Plating Solution]

Silver potassium cyanide: 40 g/L in terms of silver

Potassium cyanide=120 g/L

Potassium carbonate=40 g/L

Potassium selenocyanate=3 mg/L

The silver plating layer was formed by electroplating using the plating solution described above with an adjusted plating time at a solution temperature of 30° C. at a cathode current density of 5 A/$dm^2$. A silver electrode was used as the anode.

In each of Examples 14, 18, and 21, the silver-gold alloy plating solution that will be described below was used to form a silver-gold alloy plating layer as the outermost layer. The gold potassium cyanide concentration was adjusted to 2.0 g/L in Example 14, 4.0 g/L in Example 18, and 10.0 g/L in Example 21 in terms of gold so as to achieve the silver-gold alloy ratios in the respective examples shown in Table 3.

[Silver-Gold Alloy Plating Solution]

Silver potassium cyanide: 40 g/L in terms of silver

Gold potassium cyanide: 2.0, 4.0, or 10.0 g/L in terms of gold

Potassium cyanide=120 g/L

Potassium carbonate=40 g/L

Potassium selenocyanate=3 mg/L

The silver-gold alloy plating layer was formed by electroplating using the plating solution described above with an adjusted plating time at a solution temperature of 25° C. at a cathode current density of 1 A/$dm^2$. A platinum-coated titanium electrode was used as the anode.

After that, in Examples 12 to 22, treatment with the polyallylamine polymers was performed and the triazine compound was performed when necessary in accordance with Examples 1 to 11, respectively. In Comparative Examples 4 to 6, treatment with the polyallylamine polymers was not performed as in Comparative Examples 1 to 3. Similarly to Examples 1 to 11 and Comparative Examples 1 to 3, existence or nonexistence of entry of solder into the resin-molded body 3 and leakage of the sealing member out of the resin-molded body 3 was evaluated, and the total luminous flux maintenance factor after the sulfur resistance test was measured in each of Examples 12 to 22 and Comparative Examples 4 to 6. Table 3 shows the manufacturing conditions, and Table 4 shows the results.

TABLE 3

| | Manufacturing conditions | | | | | | | |
|---|---|---|---|---|---|---|---|---|
| | Type of base member 1a | Nickel or nickel alloy plating layer 1b | Pd, Pd alloy, Rh, Rh alloy, Pt, or Pt alloy plating layer 1c1 | Gold or gold alloy plating layer 1c2 | Silver or silver alloy plating layer 1d | Composition of polyallylamine treatment solution | Tem-perature in poly-allylamine treatment | Poly-allylamine treatment time | Heat treatment |
| Example 12 | Copper alloy 194 | Ni (2) | Absent | Au (0.2) | Ag (2.5) | PAA-03 (0.5 mass %) | 40° C. | Immersion for 30 seconds | None |
| Example 13 | Copper alloy 194 | Ni (1) | Pd (0.02) | Au—Ag alloy (0.02) | Ag (3.0) | PAA-08 (0.02 mass %) + Santhiol NW (0.2 mass %) | 30° C. | Immersion for 5 seconds | None |
| Example 14 | Copper alloy 194 | Ni (6) | Rh (0.03) | Au (0.04) | Ag—Au alloy (7.0) Au ratio: 5 mass % | PAA-15 (0.01 mass %) + Santhiol NW (0.1 mass %) | 25° C. | Immersion for 15 seconds | None |
| Example 15 | Copper alloy 194 | Absent | Absent | Absent | Ag (3.5) | PAA-03 (0.5 mass %) | 30° C. | Immersion for 25 seconds | None |
| Example 16 | Copper alloy 194 | Ni—Sn alloy (2) | Absent | Au (0.3) | Ag (2.0) | PAA-08 (0.02 mass %) + Santhiol NW (0.2 mass %) | 50° C. | Spraying for 35 seconds | None |
| Example 17 | Copper alloy 194 | Ni (1) | Pd—Ni alloy (0.05) | Au (0.01) | Ag (1.5) | PAA-15 (0.01 mass %) + Santhiol NW (0.1 mass %) | 25° C. | Immersion for 45 seconds | None |
| Example 18 | Copper alloy 194 | Ni—Co alloy (2) | Absent | Au (0.4) | Ag—Au alloy (2.5) Au ratio: 10 mass % | PAA-03 (0.5 mass %) | 25° C. | Spraying for 55 seconds | None |
| Example 19 | Copper alloy 194 | Ni (3) | Rh—Co alloy (0.02) | Au (0.3) | Ag (3.5) | PAA-08 (0.02 mass %) + Santhiol NW (0.2 mass %) | 15° C. | Immersion for 60 seconds | None |
| Example 20 | 42-Alloy | NiP (2) | Pi (0.3) | Au—Co alloy (0.15) | Ag (5.0) | PAA-15 (0.01 mass %) + Santhiol NW (0.1 mass %) | 25° C. | Immersion for 15 seconds | 250° C. × two hours |
| Example 21 | Copper alloy 194 | Ni (3) | Pd (0.01) | Au (0.2) | Ag—Au alloy (2.0) Au ratio: 20 mass % | PAA-03 (0.5 mass %) | 20° C. | Immersion for 20 seconds | 450° C. × five minutes |
| Example 22 | Iron material | Ni (6) | Absent | Au (0.2) | Ag (6.5) | PAA-15 (0.01 mass %) + Santhiol NW (0.1 mass %) | 15° C. | Immersion for three seconds | None |
| Comparative Example 4 | Copper alloy 194 | Ni (1) | Absent | Au (0.2) | Ag (2.5) | None | None | None | None |
| Comparative Example 5 | Copper alloy 194 | Ni (2) | Pd (0.03) | Au (0.03) | Ag (3.0) | None | None | None | None |
| Comparative Example 6 | Copper alloy 194 | Ni (2) | Pd (0.02) | Au (0.005) | Ag (7.0) | None | None | None | None |
| | | Numbers in parentheses indicate plating thicknesses (μm). | Numbers in parentheses indicate plating thicknesses (μm). | Numbers in parentheses indicate plating thicknesses (μm). | | | | | |

TABLE 4

| | Evaluation results | | |
|---|---|---|---|
| | Entry of solder into resin-molded body | Leakage of sealing resin in resin-molded body | Total luminous flux maintenance factor in sulfurization test (%) |
| Example 12 | No | No | 96 |
| Example 13 | No | No | 96 |
| Example 14 | No | No | 96 |
| Example 15 | No | No | 96 |
| Example 16 | No | No | 96 |
| Example 17 | No | No | 96 |
| Example 18 | No | No | 96 |
| Example 19 | No | No | 96 |
| Example 20 | No | No | 96 |
| Example 21 | No | No | 96 |
| Example 22 | No | No | 96 |
| Comparative Example 4 | Yes | Yes | 87 |
| Comparative Example 5 | Yes | Yes | 86 |
| Comparative Example 6 | Yes | Yes | 88 |

Examples 23 to 28 and Comparative Examples 7 to 9

On each of surfaces of a base member 1*a* that will be described below, a nickel plating layer was formed as the nickel or nickel alloy plating layer 1*b* when necessary, and a gold, silver, or silver-gold alloy plating layer was formed thereon as the outermost layer 1*d*, the nickel or nickel alloy plating layer 1*b* and the outermost layer 1*d* being formed in this order by electroplating using plating solutions of bath compositions that will be described below under respective conditions to form a metal structure 1 for an optical semiconductor device as shown in FIG. 2A. After that, the step of performing immersion in a solution containing a poly allylamine polymer, the step of washing, and the step of drying were performed in each of Examples 23 to 28. Table 5 shows the thicknesses (μm) of the layers, the compositions of solutions containing a polyallylamine polymer, and treatment conditions in examples and comparative examples.

Base Member 1a in Examples 23 to 28 and Comparative Examples 7 to 9

In each of Examples 23 to 28 and Comparative Examples 7 to 9, a pure copper plate (an oxygen-free copper plate measuring 90 mm in length, 60 mm in width, and 0.5 mm in thickness) was used as the base member.

Nickel or Nickel Alloy Plating Layer 1b in Examples 23 and 24 and Comparative Example 7

As the nickel or nickel alloy plating layer 1*b*, a nickel plating layer was formed in each of Examples 23 and 24 and Comparative Example 7. The plating layer 1*b* was not formed in Examples 25 to 28 and Comparative Examples 8 and 9.

The nickel plating layer in each of Examples 23 and 24 and Comparative Example 7 was formed using substantially the same plating solution as in Example 1 under substantially the same conditions as in Example 1 except that the plating time was adjusted.

Outermost Layer 1d in Examples 23 to 28 and Comparative Examples 7 to 9

As the outermost layer 1*d*, a gold plating layer was formed in each of Examples 23 and 24 and Comparative Example 7, a silver plating layer was formed in each of Examples 25 and 26 and Comparative Example 8, and a silver-gold alloy plating layer was formed in each of Examples 27 and 28 and Comparative Example 9.

The gold plating layer serving as the outermost layer 1*d* in each of Examples 23 and 24 and Comparative Example 7 was formed using substantially the same plating solution as in Example 1 under substantially the same conditions as in Example 1 except that the plating time was adjusted.

The silver plating layer serving as the outermost layer 1*d* in each of Examples 25 and 26 and Comparative Example 8 was formed using substantially the same plating solution as in Example 12 under substantially the same conditions as in Example 12 except that the plating time was adjusted so as to achieve the plating thickness shown in Table 5.

The silver-gold alloy plating layer serving as the outermost layer 1*d* in each of Examples 27 and 28 and Comparative Example 9 was formed using substantially the same plating solution as in Example 18 under substantially the same conditions as in Example 18 except that the plating time was adjusted so as to achieve the plating thickness shown in Table 5.

After that, in each of Examples 23 and 25, immersion in an aqueous solution containing 0.5 mass % of the polyallylamine polymer PAA-08 (registered trademark; with a weight-average molecular weight of 8,000) manufactured by Nittobo Medical Co., Ltd. was performed at 30° C. for 15 seconds, and washing with water and then drying were performed.

In Example 27, immersion in an aqueous solution containing 0.7 mass % of the polyallylamine polymer PAA-03 (registered trademark; with a weight-average molecular weight of 3,000) manufactured by Nittobo Medical Co., Ltd. was performed at 30° C. for 15 seconds, and washing with water and then drying were performed.

In each of Examples 24, 26, and 28, immersion in an aqueous solution containing 0.05 mass % of the polyallylamine polymer PAA-08 (registered trademark; with a weight-average molecular weight of 8,000) manufactured by Nittobo Medical Co., Ltd. and 0.2 mass % of 1,3,5-triazine-2,4,6-thiol trisodium salt (Santhiol N-W manufactured by Sankyo Kasei Co., Ltd.) was performed at 30° C. for 15 seconds, and washing with water and then drying were performed.

Similarly to Comparative Examples 1 to 3, treatment with the polyallylamine polymers were not performed in Comparative Examples 7 to 9.

Evaluation of Adhesion to Resin Material

An epoxy resin was applied on the outermost layer of the metal structure for an optical semiconductor device obtained in each of Examples 23 to 28 and the outermost layer of the plating obtained in each of Comparative Examples 7 to 9, portions of the resin was cut to have a diameter of 7 mm, and the other portion of the resin was removed. After that, the epoxy resin applied on the outermost layer of the metal structure for an optical semiconductor device and the outermost layer of the plating was cured by heat treatment at 150° C. for four hours, the shear strength between the surface of the outermost layer in each of Examples 23 to 28 and Comparative Examples 7 to 9 and the epoxy resin was measured 5 times, and respective averages were calculated. Relative evaluation was performed regarding the shear strength in Comparative Example 7 as 100 in Examples 23 and 24, the shear strength in Comparative Example 8 as 100 in Examples 25 and 26, and the shear strength in Comparative Example 9 as 100 in Examples 27 and 28. The shear strength was measured with the multipurpose bondtester 4000PXY manufactured by Nordson DAGE. Table 5 shows the results.

TABLE 5

| | Production conditions of samples | | | | | | | |
|---|---|---|---|---|---|---|---|---|
| | Type of base member 1a | Nickel plating layer 1b | Gold, silver, or silver alloy plating layer 1d | Composition of polyallylamine treatment solution | Temperature in polyallylamine treatment | Polyallylamine treatment time | Heat treatment | Relative proportion of shear strength (%) |
| Comparative Example 7 | Pure copper | Ni (2) | Au (0.2) | None | No treatment | No treatment | None | 100 |
| Example 23 | Pure copper | Ni (2) | An (0.2) | PAA-08 (0.5 mass %) | 30° C. | Immersion for 15 seconds | None | 1130 |
| Example 24 | Pure copper | Ni (2) | Au (0.2) | PAA-08 (0.05 mass %) + Santhiol NW (0.2 mass %) | 30° C. | Immersion for 15 seconds | None | 1840 |
| Comparative Example 8 | Pure copper | Absent | Ag (3) | None | No treatment | No treatment | None | 100 |
| Example 25 | Pure copper | Absent | Ag (3) | PAA-08 (0.5 mass %) | 30° C. | Immersion for 15 seconds | None | 610 |
| Example 26 | Pure copper | Absent | Ag (3) | PAA-08 | 30° C. (0.05 mass %) + Santhiol NW (0.2 mass %) | 15 seconds Immersion for | None | 850 |
| Comparative Example 9 | Pure copper | Absent | AgAu (3) | None | No treatment | No treatment | None | 100 |
| Example 27 | Pure copper | Absent | AgAu (3) | PAA-03 (0.7 mass %) | 30° C. | Immersion for 15 seconds | None | 960 |
| Example 28 | Pure copper | Absent | AeAu (3) | PAA-08 (0.05 mass %) + Santhiol NW (0.2 mass %) | 30° C. | Immersion for 15 seconds | None | 1240 |
| | | Numbers in parentheses indicate plating thicknesses (μm). | Numbers in parentheses indicate plating thicknesses (μm). | | | | | |

As for the optical semiconductor device in each of Examples 1 to 22, entry of solder into the resin-molded body 3 was not observed, leakage of the sealing member out of the resin-molded body 3 was not observed, and adhesion between the resin material and the lead frame 10 was good. The optical semiconductor device in each of Examples 1 to 22 retained substantially the same total luminous flux after the sulfurization test as the total luminous flux before the sulfurization test. Adhesion between the metal structure for an optical semiconductor device in each of Examples 1 to 22 and a resin material constituting a member was good.

In the optical semiconductor device in each of Comparative Examples 1 to 6, entry of solder into the resin-molded body 3 was observed, and leakage of the sealing member out of the resin-molded body 3 was observed. Therefore, adhesion between the resin material constituting a member and the lead frame 10 had not been improved. The total luminous flux maintenance factor of the optical semiconductor device in each of Comparative Examples 4 to 6 was greatly reduced in the sulfurization test.

Further, compared with the metal structures for an optical semiconductor device in Comparative Examples 7 to 9, the metal structures for an optical semiconductor device in Examples 23 to 28 showed improved shear strength and good adhesion to the resin material. These effects were greater in Examples 24, 26, and 28 in each of which the solution containing a polyallylamine polymer also contained the triazine compound.

As described above, in the metal structure for an optical semiconductor device according to the present disclosure, a base body with a polyallylamine polymer adhered to its surface can be easily manufactured by immersing in or applying a solution containing the polyallylamine polymer the base body, the base body including an outermost layer containing at least one selected from the group consisting of gold, silver, a gold alloy, and a silver alloy (preferably plating of at least one selected from the group consisting of gold, silver, a gold alloy, and a silver alloy). This can result in manufacturing a metal structure for an optical semiconductor device in which adhesion to a resin material is increased.

DENOTATION OF REFERENCE NUMERALS

1 metal structure for an optical semiconductor device
1*a* base member
1*b* nickel or nickel alloy plating layer
1*c* undercoating layer
1*c*1 noble metal plating layer
1*c*2 gold or gold alloy plating layer
1*d* outermost layer (gold, silver, gold alloy, or silver alloy layer)
12 first embedded portion
13 second embedded portion
2 light-emitting element
3 resin-molded body
31 lateral wall
32 a portion of bottom surface
4 bonding member
5 sealing member
6 wire
10 lead frame

100 optical semiconductor device

200 optical semiconductor device

What is claimed is:

1. A method of manufacturing a metal structure for an optical semiconductor device, comprising a step of performing a treatment of immersing a base body in a solution containing a polyallylamine polymer and/or applying to the base body the solution containing the polyallylamine polymer, the base body including an outermost layer at at least a portion of a surface of the base body, the outermost layer including a plating of at least one selected from the group consisting of gold, silver, a gold alloy, and a silver alloy, to form a film containing the polyallylamine polymer, wherein the solution containing the polyallylamine polymer further contains a triazine compound.

2. The method according to claim 1, wherein a content of the polyallylamine polymer is 0.01 mass % or more and 1.0 mass % or less with a total amount of the solution containing a polyallylamine polymer being 100 mass %.

3. The method according to claim 1, wherein a content of the triazine compound is 0.01 mass % or more and 1.0 mass % or less with a total amount of the solution containing a polyallylamine polymer being 100 mass %.

4. The method according to claim 1, wherein the triazine compound comprises a triazine thiol compound.

5. The method according to claim 1, wherein a temperature of the solution containing the polyallylamine polymer in the step of performing the treatment is 15° C. or more and 50° C. or less.

6. The method according to claim 1, wherein a treatment time of the step of performing the treatment is three seconds or greater and 60 seconds or less.

7. The method according to claim 1, further comprising, after the step of performing the treatment, in this order:

a step of washing the base body having undergone the step of performing the treatment; and a step of drying the base body having undergone the step of washing.

8. The method according to claim 7, further comprising, after the step of drying, a step of heat-treating the base body having undergone the step of washing.

9. The method according to claim 1, wherein the base body comprises a base member containing copper or a copper alloy.

10. The method according to claim 9, wherein at least one selected from the group consisting of a nickel or nickel alloy plating layer, a palladium or palladium alloy plating layer, a rhodium or rhodium alloy plating layer, and a platinum or platinum alloy plating layer is disposed between the outermost layer and the base member.

11. A method of manufacturing an optical semiconductor device, comprising forming a resin-molded body in contact with the metal structure for an optical semiconductor device manufactured by the method of claim 1.

12. A method of manufacturing a metal structure for an optical semiconductor device, comprising a step of performing a treatment of immersing a base body in a solution containing a polyallylamine polymer and/or applying to the base body the solution containing the polyallylamine polymer, the base body including an outermost layer at at least a portion of a surface of the base body, the outermost layer including a plating of at least one selected from the group consisting of gold, silver, a gold alloy, and a silver alloy, to form a film containing the polyallylamine polymer, wherein the solution containing the polyallylamine polymer further contains a triazine compound.

13. The method according to claim 12, wherein a content of the polyallylamine polymer is 0.01 mass % or more and 1.0 mass % or less with a total amount of the solution containing a polyallylamine polymer being 100 mass %.

14. The method according to claim 12, wherein a content of the triazine compound is 0.01 mass % or more and 1.0 mass % or less with a total amount of the solution containing a polyallylamine polymer being 100 mass %.

15. The method according to claim 12, wherein the triazine compound comprises a triazine thiol compound.

16. The method of manufacturing according to claim 1, wherein the triazine compound is a triazine thiol compound.

17. The method of manufacturing according to claim 12, wherein the triazine compound is a triazine thiol compound.

* * * * *